(12) United States Patent
Ke et al.

(10) Patent No.: US 7,714,666 B2
(45) Date of Patent: May 11, 2010

(54) PHASE LOCKED LOOP FREQUENCY SYNTHESIZER AND METHOD FOR MODULATING THE SAME

(75) Inventors: Ling-Wei Ke, Hsinchu Hsien (TW); Tai Yuan Yu, Taoyuan Hsien (TW); Hsin-Hung Chen, Miaoli Hsien (TW)

(73) Assignee: Mediatek Inc., Hsin-Chu (TW)

( * ) Notice: Subject to any disclaimer, the term of this patent is extended or adjusted under 35 U.S.C. 154(b) by 437 days.

(21) Appl. No.: 11/745,611

(22) Filed: May 8, 2007

(65) Prior Publication Data

US 2008/0003953 A1 Jan. 3, 2008

Related U.S. Application Data

(60) Provisional application No. 60/804,837, filed on Jun. 15, 2006.

(51) Int. Cl.
*H03L 7/00* (2006.01)
(52) U.S. Cl. ............... 331/16; 331/34; 331/177 R; 327/156; 375/376
(58) Field of Classification Search ........... 331/16, 331/34, 177 R; 327/156; 375/376
See application file for complete search history.

(56) References Cited

U.S. PATENT DOCUMENTS

| | | | |
|---|---|---|---|
| 6,008,703 A | 12/1999 | Perrott et al. | |
| 6,011,815 A | 1/2000 | Eriksson et al. | |
| 6,047,029 A * | 4/2000 | Eriksson et al. | ............ 375/247 |
| 6,933,798 B2 | 8/2005 | Hammes et al. | |
| 7,298,218 B2 * | 11/2007 | Ghazali et al. | ............ 331/16 |
| 2002/0191727 A1 | 12/2002 | Staszewski et al. | |
| 2005/0025276 A1 | 2/2005 | Hammes et al. | |

* cited by examiner

*Primary Examiner*—Arnold Kinkead
(74) *Attorney, Agent, or Firm*—Thomas, Kayden, Horstemeyer & Risley

(57) ABSTRACT

A phase locked loop frequency synthesizer including a phase locked loop, a frequency regenerator and a modulation processor, resistant to distortion induced by the frequency regenerator and conforming to transmission specifications. The phase locked loop comprises a detector generating a phase detection signal based on phase difference between a reference signal and a feedback signal, a loop filter, a voltage control oscillator generating a first output modulation signal and a frequency dividing unit varying a division factor based on a processed input modulation signal and dividing the frequency of the first output modulation signal by a division factor to generate the feedback signal. The frequency regenerator generates a second output modulation signal with a frequency range not overlapping an output frequency range of the voltage control oscillator. The modulation processor generates the processed input modulation signal to adjust the division factor of the frequency dividing unit and compensating for distortion induced by the frequency regenerator.

66 Claims, 20 Drawing Sheets

US 7,714,666 B2

PHASE LOCKED LOOP FREQUENCY SYNTHESIZER AND METHOD FOR MODULATING THE SAME

BACKGROUND OF THE INVENTION

1. Field of the Invention

The invention relates to frequency synthesis employing a phase locked loop and more particularly to techniques for modulating a phase locked loop frequency synthesizer.

2. Description of the Related Art

Conventional communication transmitters traditionally employ a phase locked loop (PLL) synthesizer for frequency synthesis of a communication signal modulated with transmission data. The PLL frequency synthesizer provides precise control of the frequency of the communication signal and accordingly enables the transmission data to be reliably transmitted at a stable, known frequency.

Recently, $\Sigma$-$\Delta$ modulators are used in PLL frequency synthesizers to control the division factor of a multi-modulus divider. Phase locked loop frequency synthesis is a well-known technique to generate one of many related signals from a frequency variable voltage controlled oscillator (VCO). In a PLL, an output signal from the VCO is coupled to a programmable frequency divider which divides the output signal by a selected integer to generate a frequency divided signal supplied to a phase detector. The phase detector compares the frequency divided signal to a reference signal from another fixed frequency oscillator often selected for stability of frequency over time and environmental changes. Any difference in phase between the frequency divided signal and the reference signal is output from the phase detector, coupled through a loop filter, and applied to the VCO such that the output signal from the VCO changes in frequency, minimizing phase error between the frequency divided signal and the reference signal. With a constant division factor, the output frequency step size is kept equal with the reference signal frequency. With the PLL, an engineering compromise must be struck between the competing requirements of loop lock time, output frequency step size, noise performance and spurious signal generation.

To overcome the limitations of the PLL, programmable frequency dividers capable of effectively dividing by non-integers have been developed. Output frequency step sizes which are fractions of the reference signal frequency are obtained while maintaining a high reference frequency and wide loop bandwidth. The synthesizers are known as fractional-N frequency synthesizers.

Furthermore, an $\Sigma$-$\Delta$ modulator can be used to control the frequency divider of the phase locked loop. Characteristics of an $\Sigma$-$\Delta$ modulator are such that the quantization noise at its output tends to be toward the high end of the spectrum. The $\Sigma$-$\Delta$ modulator is a quantizer that uses feedback to reduce the quantization noise in a limited frequency band. For this application, the $\Sigma$-$\Delta$ modulator preferably has low quantization noise within the bandwidth of the modulation. The $\Sigma$-$\Delta$ modulator may be any type of $\Sigma$-$\Delta$ modulator, such as those described in Steven R. Northsworthy, Richard Schrier and Gabor Temes, Delta-Sigma Data Converters. Theory, Design and Simulation, IEEE Press 1997.

FIG. 1 is a block diagram of an $\Sigma$-$\Delta$ modulator controlled PLL frequency synthesizer 100. As shown, the phase locked loop frequency synthesizer 100 comprises a phase locked loop 110, a modulation processor 120, and a frequency regenerator 130. A periodic reference signal $S_R$ is fed to a phase detector 101 together with a feedback signal $S_F$ output by a multiple-modulus frequency divider (MMD) 105. The output of the phase detector 101 is a pulse related to the phase difference between the reference signal $S_R$ and the feedback signal $S_F$. The output of the phase detector 202 is filtered through a loop filter 102 and fed to a voltage controlled oscillator (VCO) 103. Due to the feedback in the phase locked loop, the frequency of a first output modulation signal $S_{OM1}$ output by the VCO 103 is driven to equal the frequency of the reference signal $S_R$ multiplied by the division factor of the frequency divider 105. Hence, the frequency of the first output modulation signal $S_{OM1}$ can be controlled by controlling the division factor. In the $\Sigma$-$\Delta$ modulator 106 controlled PLL frequency synthesizer 100, the division factors are generated using an $\Sigma$-$\Delta$ modulator 106. The division factor of the frequency divider 105 can be changed once every frequency period of the reference signal $S_R$. Channel selection can be performed by adding in an adder 108 an offset signal $S_{OFF}$ to the input of the $\Sigma$-$\Delta$ modulator 106. The output of the $\Sigma$-$\Delta$ modulator 106 is then used to control the division factor in the frequency divider.

A modulation processor 120 generates, based on an input modulation signal $S_{IM}$, the input to the $\Sigma$-$\Delta$ modulator 106. The modulation processor 120 conventionally comprises a waveform generator 121 for pulse shaping and a PLL compensator for compensation of distortion induced by the PLL 110. Various modulation compensation circuits can compensate for distortion induced by the PLL 100 and enable wider bandwidth PLL modulation. For example, Perrott et al., in U.S. Pat. No. 6,008,703, disclose a PLL comprising a frequency response comprising a characteristic cutoff frequency, a modulation data receiver for receiving from a modulation source digital input modulation data comprising a bandwidth that exceeds the cutoff frequency, and a digital processor for digitally processing the input modulation data to amplify modulation data at frequencies higher than the phase locked loop cutoff frequency; and Eriksson et al. in U.S. Pat. No. 6,011,815, disclose pre-filtering for mitigating the distortion of the PLL.

The first output modulation signal $S_{MO1}$ generated by the PLL 110 is further provided to the frequency regenerator 130. The frequency regenerator 130 is implemented to generate a second output modulation signal $S_{OM2}$ for transmission and with a frequency range not overlapping the output frequency range of the VCO 103 to prevent the VCO 130 from being pulled or interfered by circuits such as a power amplifier following the PLL frequency synthesizer 100. Typically, the frequency regenerator 130 is implemented as a frequency divider or a frequency multiplier, and/or frequency mixers.

Although the frequency regenerator 130 in the conventional PLL frequency synthesizer 100 solves pulling and interference issues, distortion, noise, and timing errors can be generated. More specifically, compared to the output directly provided by the VCO in a PLL frequency synthesizer without the implementation of frequency regenerator, the modulation index of the second output modulation signal $S_{OM2}$ in the PLL 100 is distorted, and both the noise and timing phase errors of the second output modulation signal $S_{OM2}$ n the PLL frequency synthesizer 100 are greater. As a result, decreased performance criteria of transmission specifications may occur.

BRIEF SUMMARY OF THE INVENTION

Accordingly, the invention provides a PLL frequency synthesizer comprising a frequency regenerator, resistant to distortion induced thereby and conforming to transmission specifications.

The invention provides a phase locked loop frequency synthesizer, comprising a phase locked loop, a frequency regenerator and a modulation processor. The phase locked loop comprises a detector receiving a reference signal and a feedback signal to generate a phase detection signal based on phase difference therebetween, a loop filter filtering the phase detection signal to generate a control signal, a voltage control oscillator generating a first output modulation signal with a varying frequency based on the control signal, and a frequency dividing unit varying a division factor based on a processed input modulation signal and dividing the frequency of the first output modulation signal by a division factor to generate the feedback signal. The frequency regenerator alters the frequency of first output modulation signal to generate a second output modulation signal with a frequency range not overlapping an output frequency range of the voltage control oscillator. The modulation processor processes an input modulation signal to generate the processed input modulation signal to adjust the division factor of the frequency dividing unit. The processing of the input modulation signal comprises compensation for distortion induced by the frequency regenerator.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
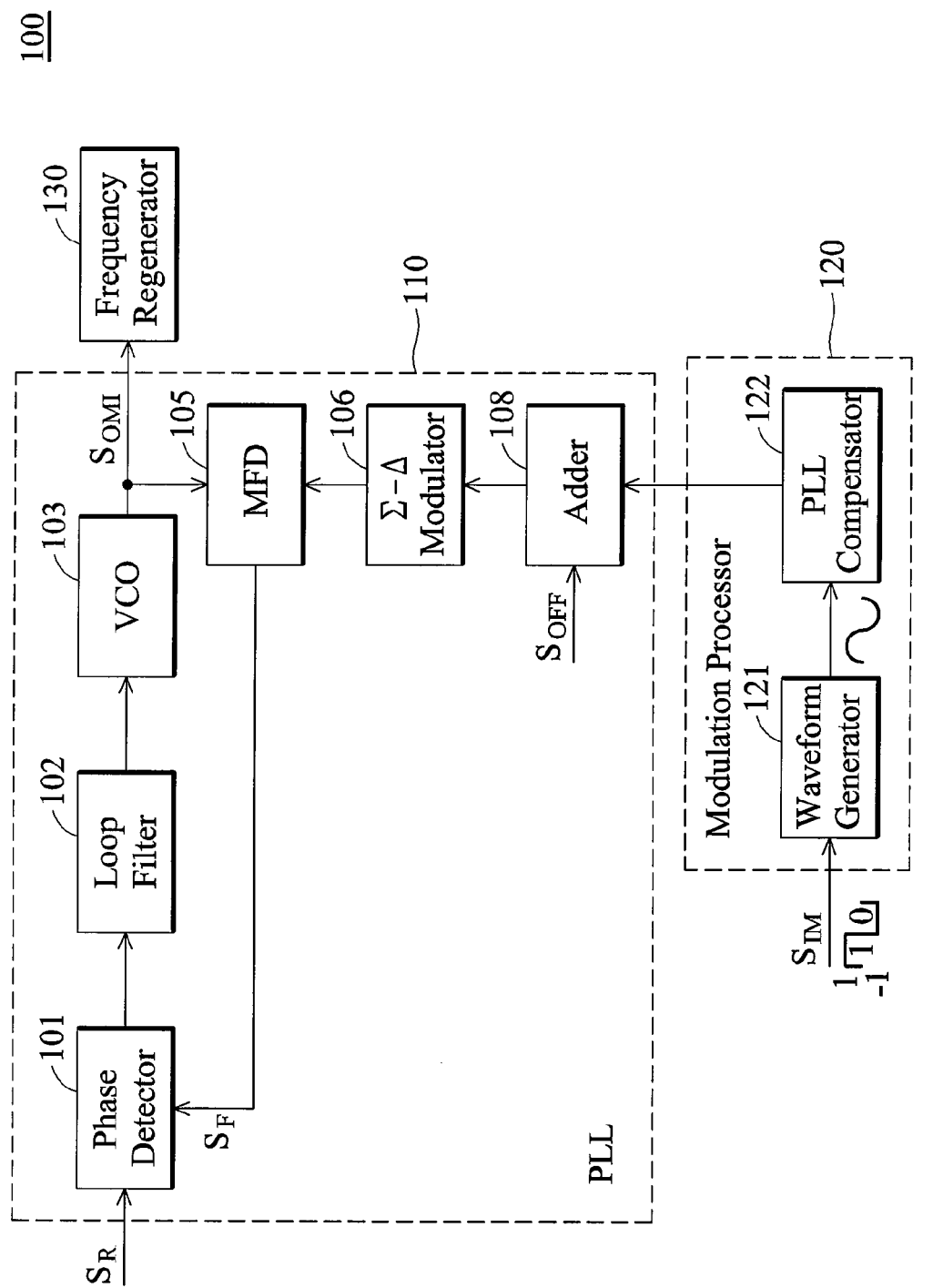
FIG. 1 is a block diagram of a conventional phase locked loop frequency synthesizer.
Figure 2:
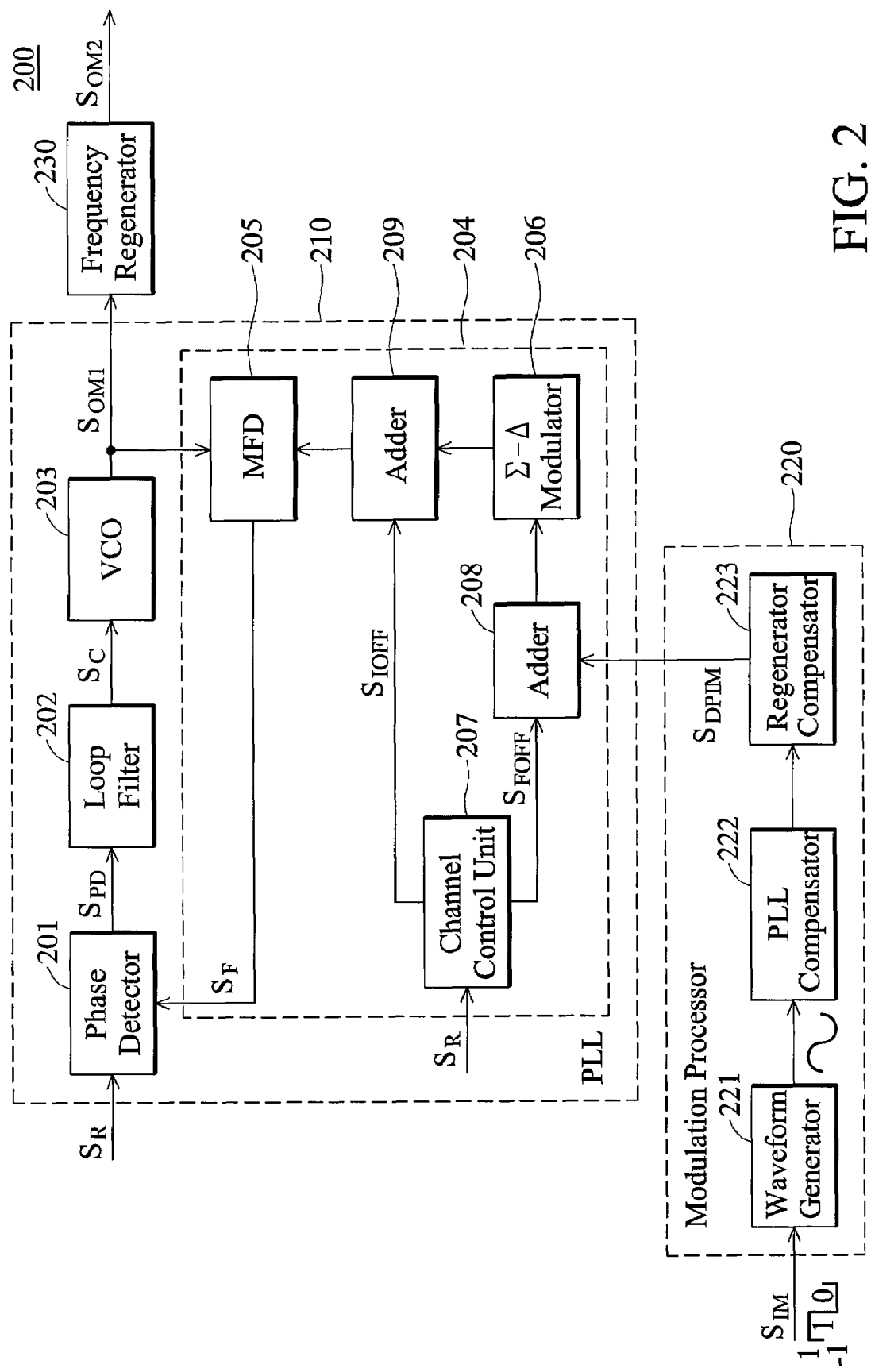
FIG. 2 is a block diagram of a phase locked loop (PLL)-frequency synthesizer 600 in accordance with an embodiment of the invention.

FIG. 2 is a block diagram of a phase locked loop (PLL)-frequency synthesizer 600 in accordance with an embodiment of the invention. As shown, the PLL frequency synthesizer 200 comprises a phase locked loop 110, a modulation processor 220, and a frequency regenerator 230. A periodic reference signal $S_R$ and a feedback signal $S_F$ provided by a multiple-modulus frequency divider (MMD) 205 within a frequency driving unit 204 are fed to a phase detector 201. The phase detector 201 outputs a phase detection signal $S_{PD}$ related to the phase difference between the reference signal $S_R$ and the feedback signal $S_F$. A loop filter 202 then filters the phase detection signal $S_{PD}$ and provides a control signal $S_C$ to a voltage control oscillator (VCO) 203. Due to the feedback of the phase locked loop 210, the VCO 203 is driven to provide a first output modulation signal $S_{MO1}$ with frequency equal to that of the reference signal $S_R$ multiplied by the division factor of the MFD 606.

In the single-point phase locked loop frequency synthesizer 200, a digitally processed input modulation signal $S_{DPIM}$ is inserted to the PLL 210 to drive the Σ-Δ modulator 206 within the frequency driving unit 204. A division factor control signal $S_{DFC}$ output by the Σ-Δ modulator 206 is coupled to the MFD 205 to adjust the division factor of the MFD 205. A channel control unit 207 unit can be implemented within the frequency driving unit 204 to enable channel selection over a wide frequency range by generating a fractional channel offset signal $S_{FOFF}$ and an integer channel offset signal $S_{IOFF}$ according to a carrier signal $S_C$, adding the fractional channel offset signal $S_{FOFF}$ to the digitally processed input modulation signal $S_{DPIM}$ in an adder 208 at the input of the Σ-Δ modulator 206, and adding the integer channel offset signal $S_{IOFF}$ to the division factor control signal $S_{DFC}$ in another adder 209 at the output of the Σ-Δ modulator 206.

The first output modulation signal $S_{MO1}$ generated by the PLL 210 is further provided to the frequency regenerator 230. The frequency regenerator 230 is implemented to generate a second output modulation signal $S_{OM2}$ for transmission in a frequency range not overlapping the output frequency range of the VCO 203 to prevent the VCO 230 from being pulled or interfered by circuits (e.g. a power amplifier) following the PLL frequency synthesizer 200. Typically, the frequency regenerator 230 is implemented as a frequency divider or a frequency multiplier and/or frequency mixers.

The digitally processed input modulation signal $S_{DPIM}$ injected to the phase PLL 210 is generated by the modulation processor 220 according to an input modulation signal $S_{IM}$ of transmission data. The frequency of the first output modulation signal $S_{MO1}$ provided by the VCO 203 is correspondingly a signal comprising a frequency varying as a function of the input modulation signal $S_{IM}$ of the transmission data.

The input modulation signal $S_{IM}$ is first supplied to a waveform generator 221 for performing pulse shaping on the input modulation signal $S_{IM}$. In an embodiment implementing a Gaussian Frequency Shift Keyed (GFSK) modulation, the waveform generator 221 is a low-pass filter comprising a Gaussian frequency response $G_{WG}(f)$ to produce a rounded waveform.

The rounded waveform is then pre-distorted in a PLL compensator 222 to compensate for the distortion caused by the phase locked loop 210. The distortion occurs since the bandwidth of the PLL 210 must be as narrow as possible to comply with predetermined noise requirements, resulting in being less than the bandwidth of the input modulation data $S_{IM}$. The PLL compensator 222 typically has a PLL compensation frequency response $G_{PLLC}(f)$ to amplify the rounded waveform at frequencies higher than a cutoff frequency of a PLL frequency response $G_{PLL}(f)$ of the PLL 210 such that attenuation induced by the PLL 210 at frequencies higher than the cutoff frequency is compensated. Preferably, the PLL compensation frequency response $G_{PLLC}(F)$ is designed such that the cascade of the PLL compensation frequency response $G_{PLLC}(f)$ and the PLL frequency response $G_{PLL}(f)$ of the PLL 210 produces an overall cascade frequency response that is flat across the bandwidth of the input modulation signal $S_{IM}$.

The pre-distorted-rounded waveform generated by the PLL compensator 222 is then passed to a regenerator compensator 223 to compensate for distortion caused by the frequency regenerator 230. The regenerator compensator 223 then provides the processed input modulation signal $S_{DIM}$ to the frequency dividing unit 204. Preferably, compensation for modulation index distortion of the second output modulation signal $S_{OM2}$ is carried out such that the modulation index of the second output modulation signal $S_{OM2}$ achieves a modulation index specification. Accordingly, the regenerator compensator 223 enables implementation of the frequency regenerator 230 to resolve pulling and interference by the circuits following the PLL 210 and simultaneous satisfaction with modulation index specification.

The PLL compensator 223 imposes on the pre-distorted-rounded waveform generated by the PLL compensator 222 a regenerator compensation frequency response $G_{REC}(f)$ that is based on the inverse of the frequency response of the frequency regenerator 230. Preferably, the regenerator compensation frequency response $G_{REC}(f)$ is designed such that the cascade of the regenerator compensation frequency response $G_{REC}(f)$ and the regenerator frequency response $G_{REC}(f)$ of the frequency regenerator 230 produces an overall cascade transfer compensation function that is flat across the bandwidth of the input modulation signal $S_{IM}$. More preferably, the regenerator compensation frequency response $G_{REC}(f)$ is the precise inverse of a regenerator frequency response $G_{RE}(f)$ of the frequency regenerator 230. In an exemplary embodiment, the frequency regenerator 230 is a dividing-by-N frequency divider, and the regenerator compensator 223 is correspondingly implemented as a multiplying-by-N frequency multiplier. In another exemplary embodiment, the frequency regenerator 230 is a multiplying-by-N frequency multiplier, and the regenerator compensator 223 is correspondingly implemented as a dividing-by-N frequency divider. Summarily, the input modulation signal $S_{IM}$ input to the modulation processor 220 is convolved with a Gaussian pulse to smooth the resulting phase transitions, being filtered based on the frequency response $G_{PLLC}(f)$ to offset the attenuation to be imposed by the frequency response $G_{PLL}(f)$ of the PLL 210, as well as being transferred based on the frequency response $G_{REC}(f)$ to compensate for the distortion to be induced by the frequency regenerator 230.

Figure 3A:
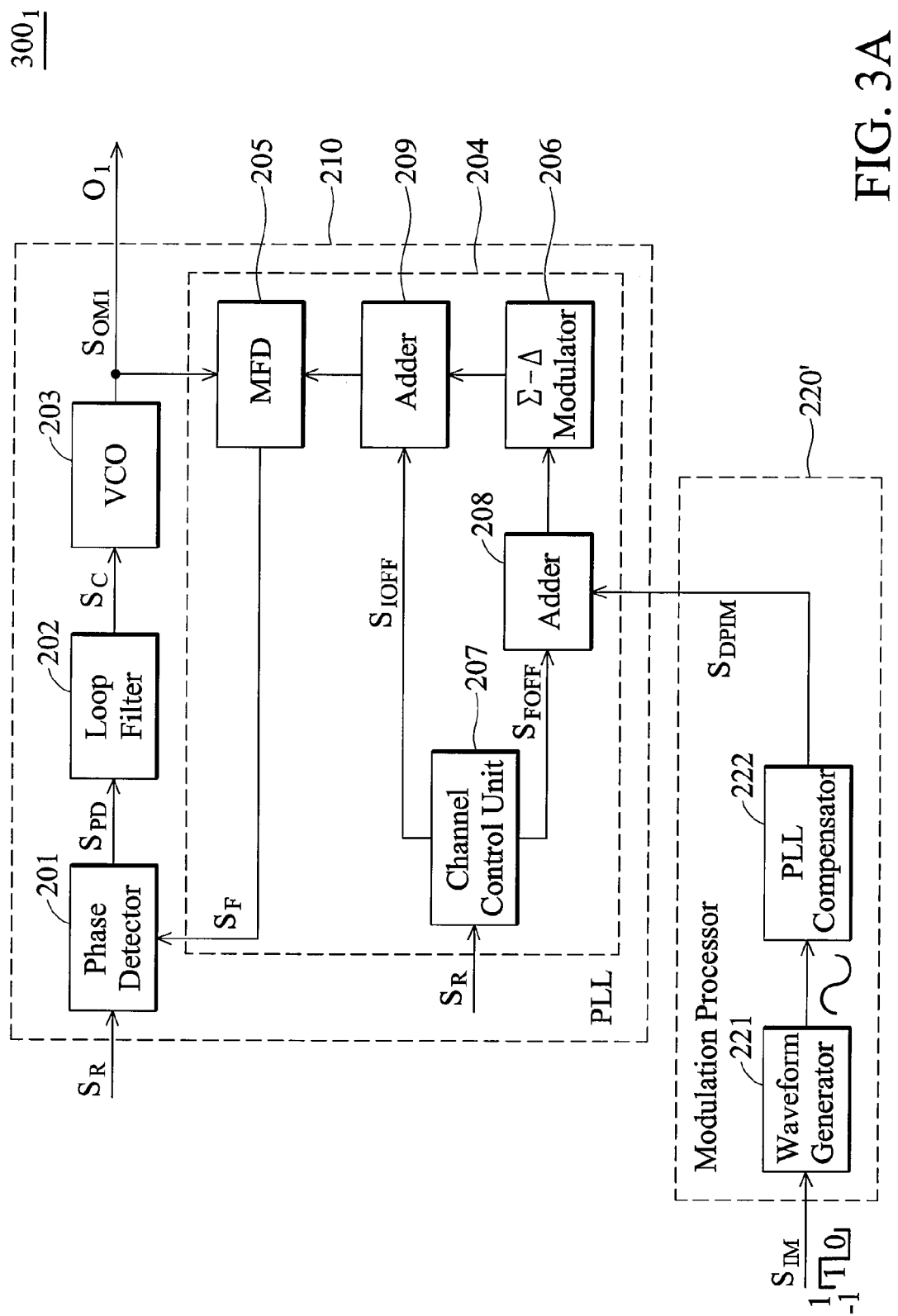
FIGS. 3A-3C are block diagrams of three different PLL frequency synthesizers for illustrating the compensation effect generated by the frequency regenerator of FIG. 2.
Figure 3B:
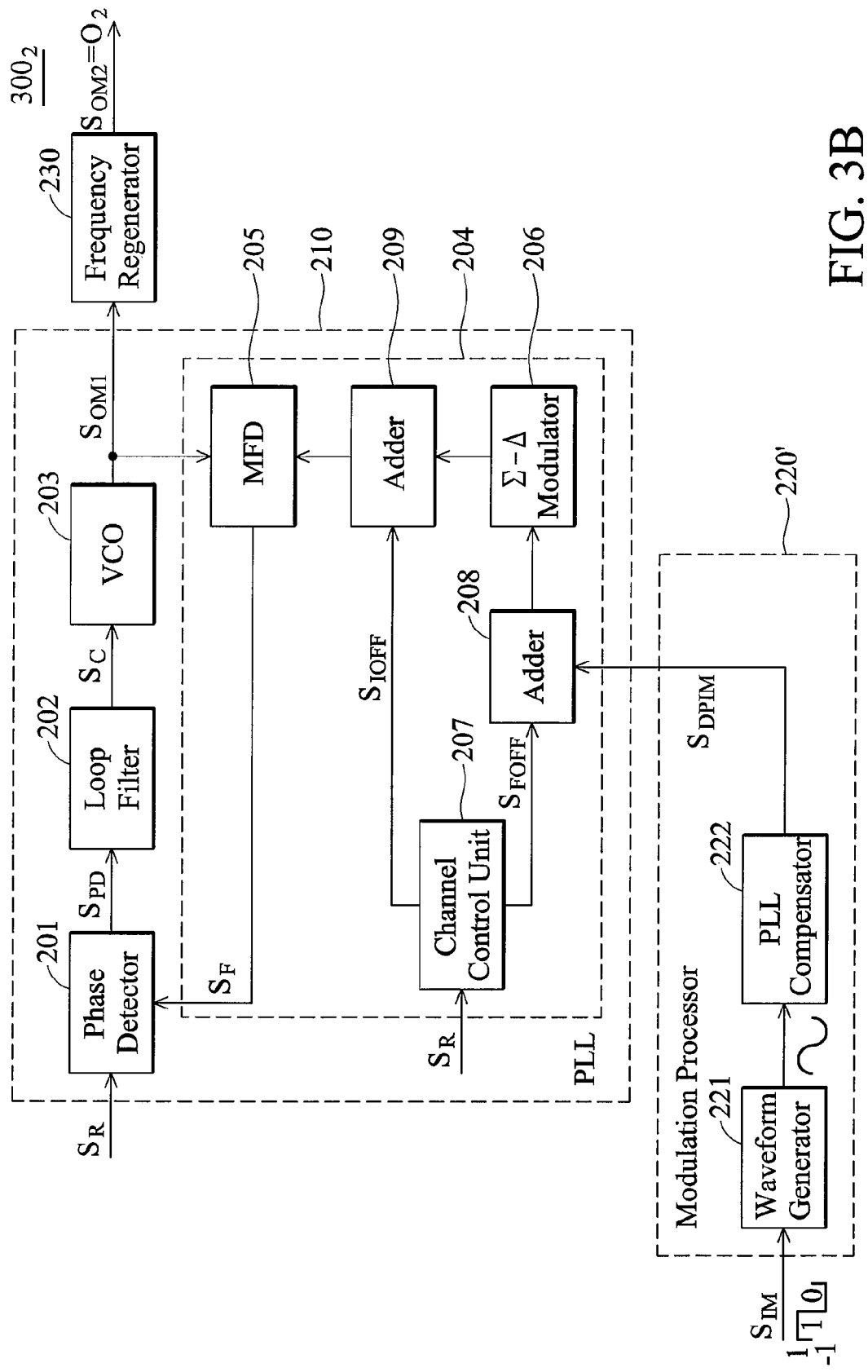
Figure 3C:
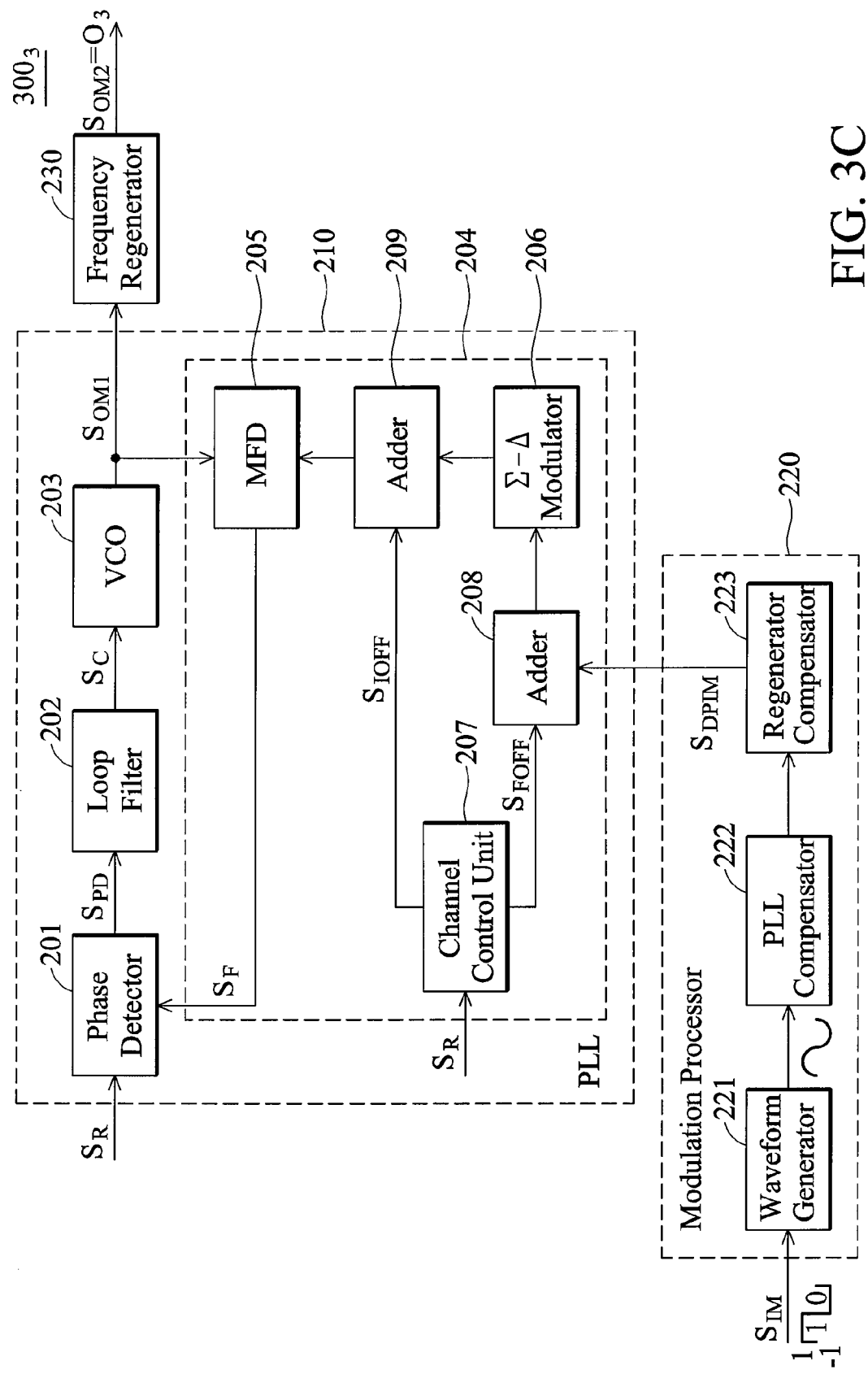

FIGS. 3A-3C are block diagrams of PLL frequency synthesizers $300_1$-$300_3$ for illustrating the compensation effect generated by the frequency regenerator 223. The PLL frequency synthesizer $300_1$ differs from PLL frequency synthesizer 200 only in that the frequency regenerator 230 is removed and the first output modulation signal $S_{OM1}$ output by the VCO 203 is directly used as an output $O_1$ of the PLL frequency synthesizer $300_1$, and the modulation processor 220 is replaced with an alternative modulation processor 220' without the regenerator compensator 223. The PLL frequency synthesizer $300_2$ differs from PLL frequency synthesizer 200 only in that the modulation processor 220 is replaced with an alternative modulation processor 220' without the regenerator compensator 223. In addition, the frequency regenerator 230 is implemented as a dividing-by-2 divider providing the second output modulation signal $S_{OM2}$ as an output $O_2$ of the PLL frequency synthesizer $300_2$. The PLL frequency synthesizer $300_3$ is an embodiment of the invention illustrating exemplary implementation of the frequency regenerator 230 and the regenerator compensator 223 in the PLL frequency synthesizer 200 of FIG. 2. In the PLL frequency synthesizer $300_3$, the frequency regenerator 230 and the regenerator compensator 223 are implemented as a dividing-by-2 divider and a multiplying-by-2 multiplier, respectively, wherein the dividing-by-2 divider 230 provides the second output modulation signal $S_{OM2}$ as an output $O_3$ of the PLL frequency synthesizer $300_2$.

Figure 4A:
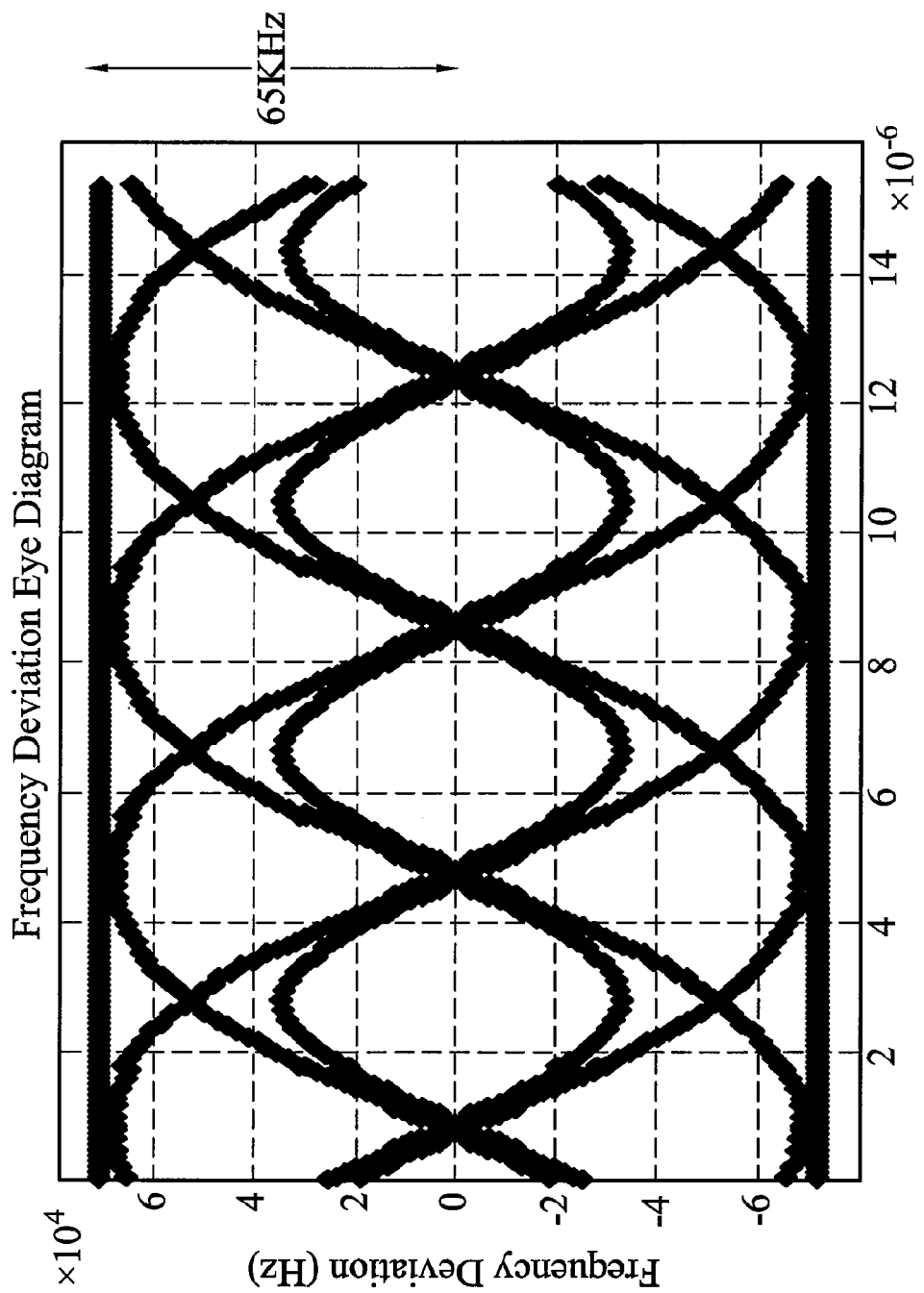
FIGS. 4A-4C are eye diagrams of the PLL frequency synthesizers of FIG. 3A-3C, respectively.
Figure 4B:
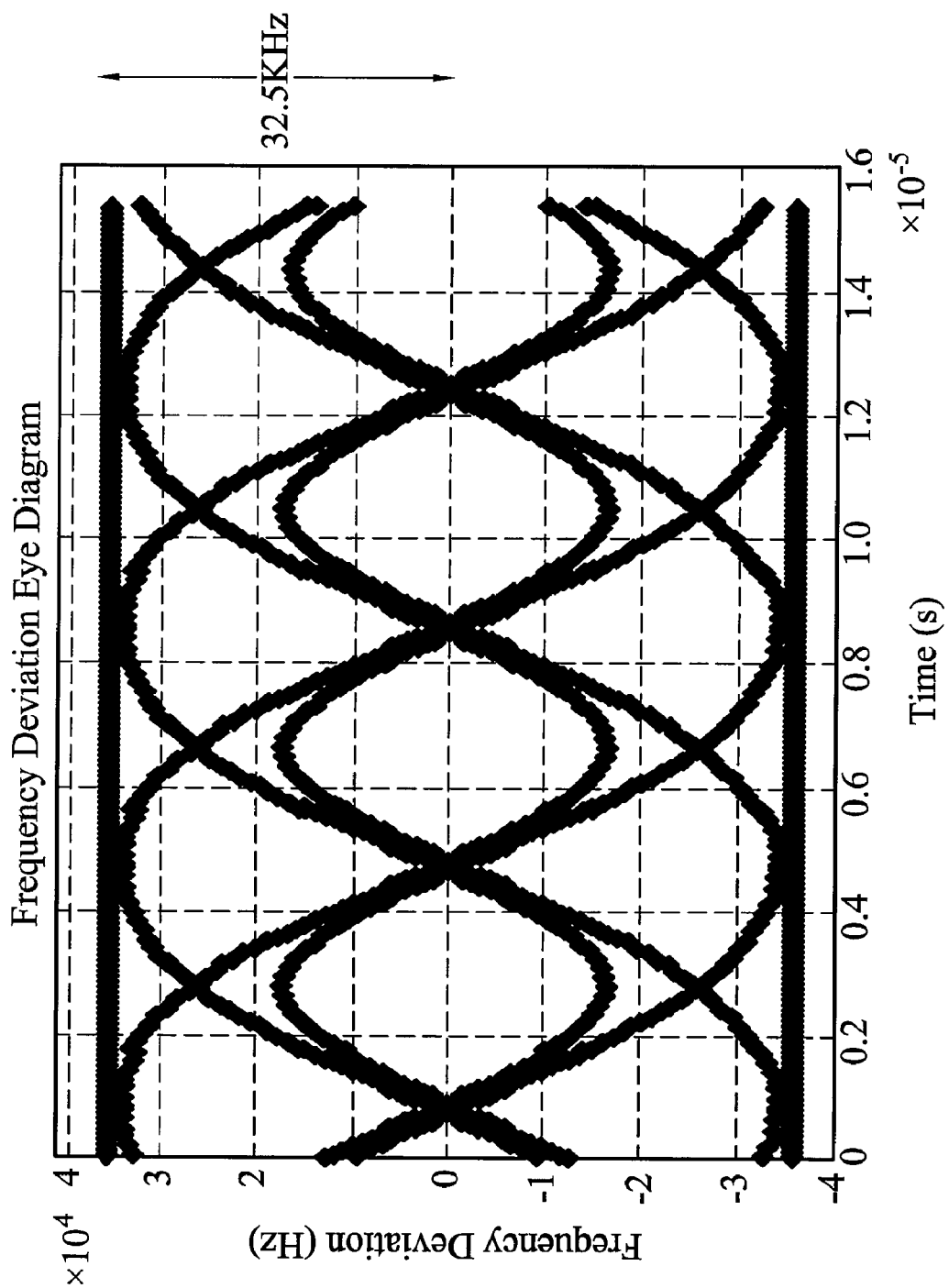
Figure 4C:
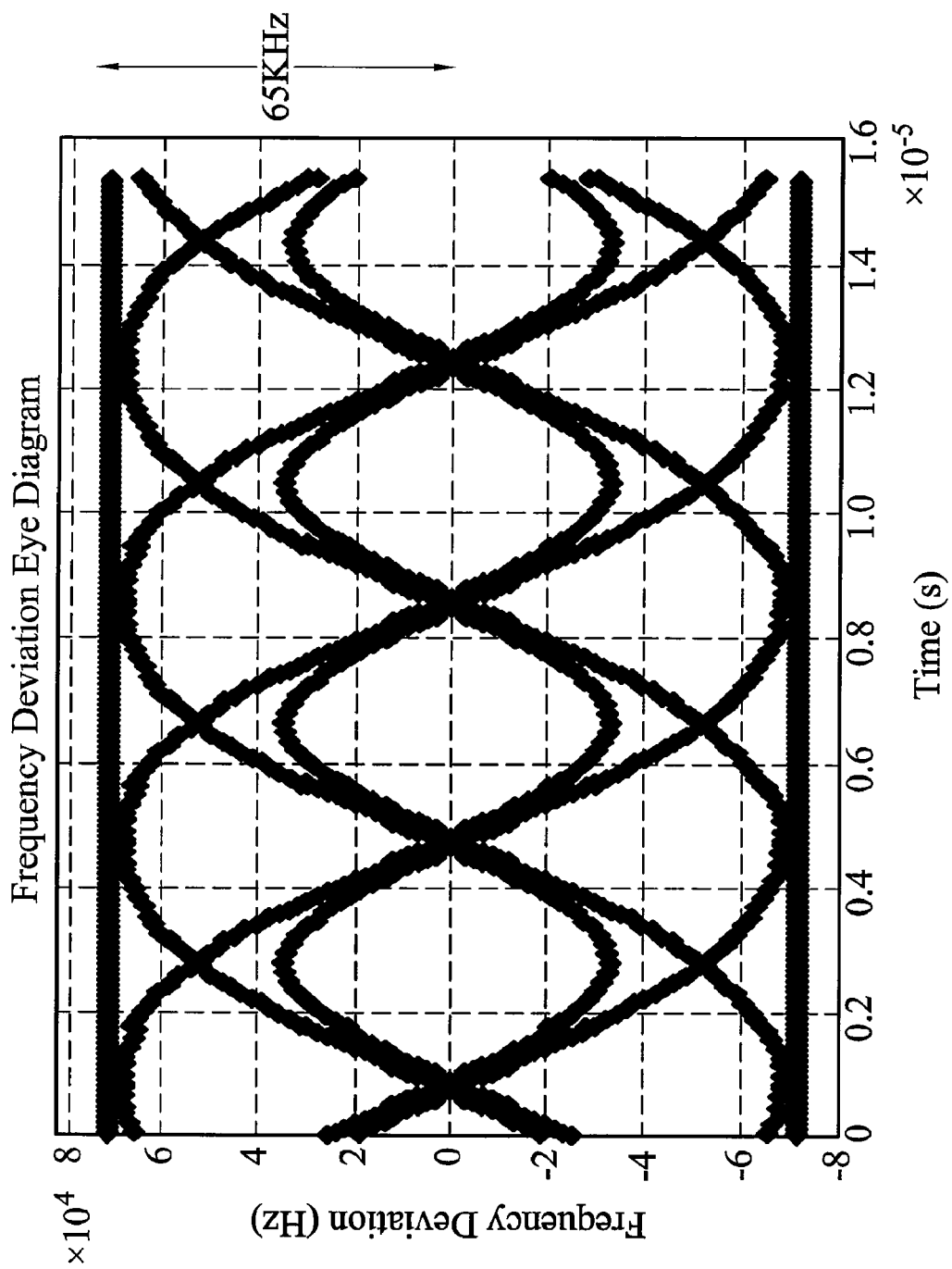

FIGS. 4A-4C are eye diagrams respectively for the outputs $O_1$-$O_3$ of the PLL frequency synthesizer $300_1$-$300_3$. The distortion induced by the frequency regenerator 230 is illustrated by comparing the FIGS. 4A and 4B. As shown, the maximum frequency deviations of FIGS. 4A and 4B are 65 KHz and 32.5 KHz, respectively, indicating the modulation index of the output $O_2$ of the PLL frequency synthesizer $300_2$ is distorted to one half by the frequency regenerator (dividing-by-2 frequency divider) 230. In addition, both the vertical and horizontal expanses in FIG. 4B exceed those in FIG. 4A, indicating that both the noise and timing phase errors of the output $O_2$ of the PLL frequency synthesizer $300_2$ exceed those of the output $O_3$ in the PLL frequency synthesizer $300_1$. The modulation index distortion results in violation of transmission specifications.

The compensation effect generated by the regenerator compensator 223 is illustrated by comparing FIGS. 4A-4B to FIG. 4C. As shown, the maximum frequency deviations of FIGS. 4A and 4B are both 65 KHz, illustrating that the modulation index is recovered. In addition, both the vertical and horizontal expanses in FIG. 4C are less than those in FIG. 4B, indicating better immunity to noise and timing phase errors with the implementation of the regenerator compensator 223. Resultingly, specifications on modulation index, noise and timing performance can be satisfied.

Figure 5A:
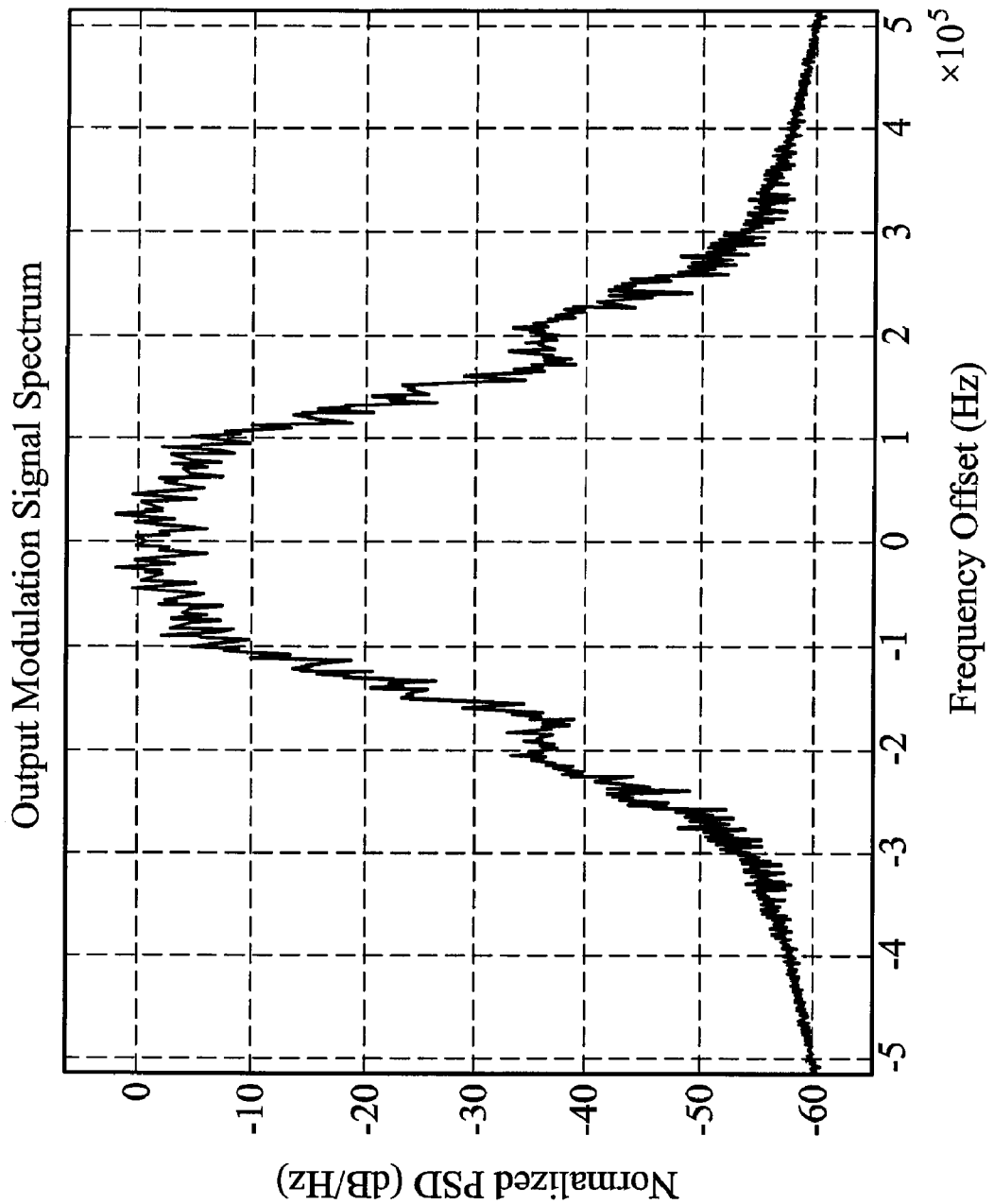
FIGS. 5A-5C are measured output spectral diagrams of the PLL frequency synthesizers of FIG. 3A-3C, respectively.
Figure 5B:
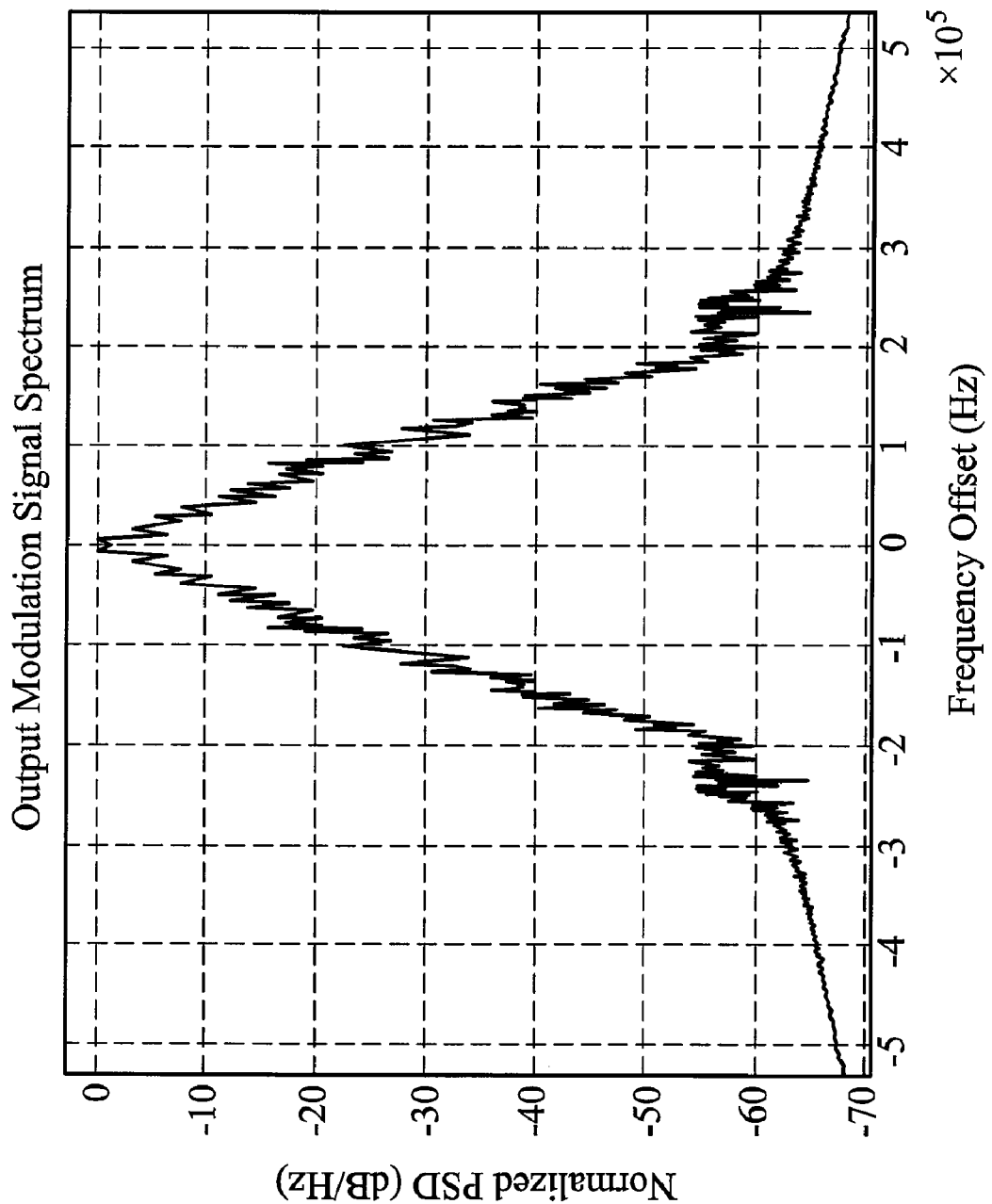
Figure 5C:
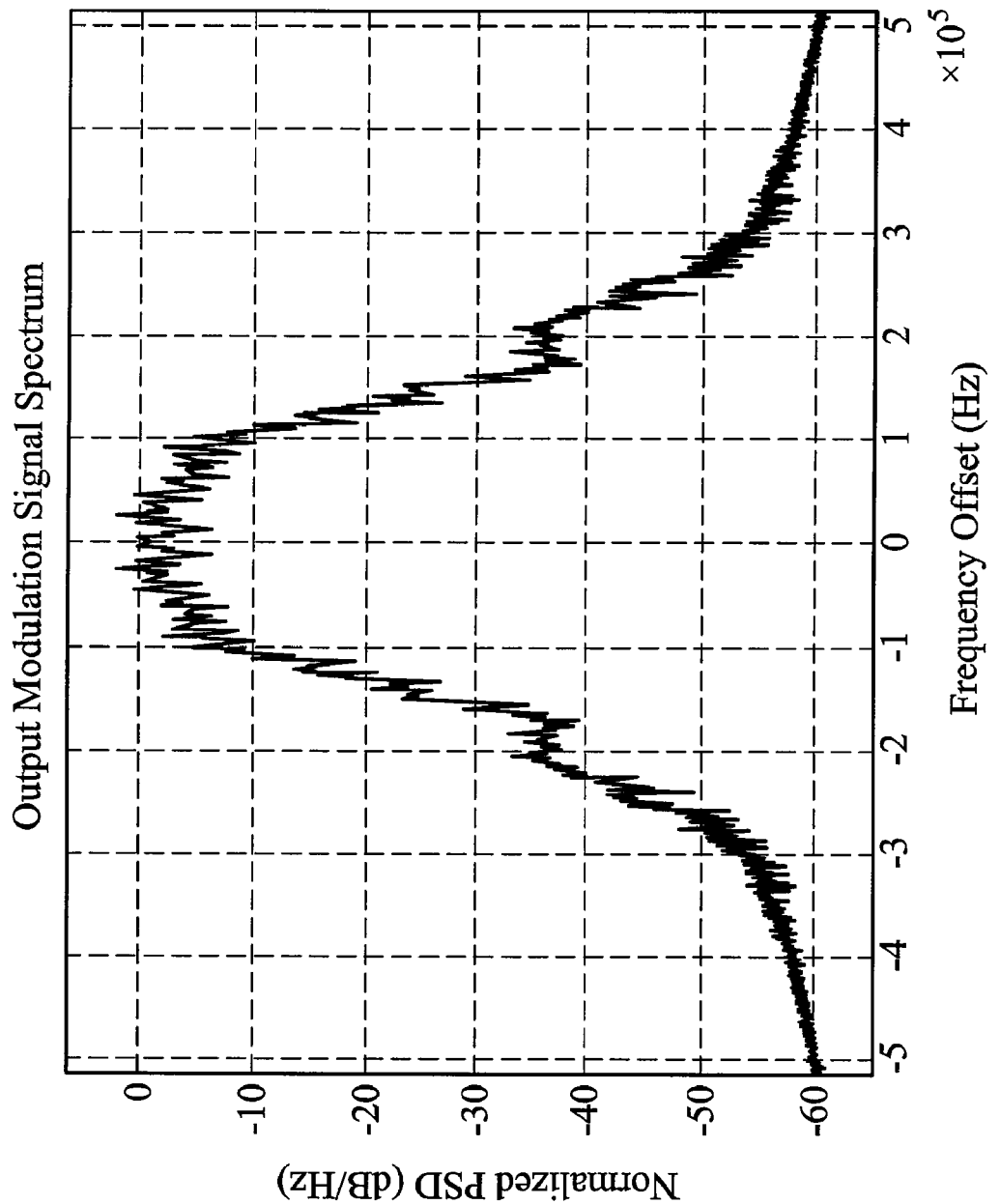

FIGS. 5A-5C are measured spectral diagrams respectively for the outputs $O_1$-$O_3$ of the PLL frequency synthesizer $300_1$-$300_3$. The distortion induced by the frequency regenerator 230 is illustrated by comparing FIGS. 5A and 5B. As shown, the spectrum of the output $O_2$ of the PLL frequency synthesizer $300_2$ is narrower and sharper than that of the output $O_1$ of the PLL frequency synthesizer $300_1$, also reflecting the fact that the modulation index of the output $O_2$ of the PLL frequency synthesizer $300_2$ is distorted to one half by the frequency regenerator (dividing-by-2 frequency divider) 230. The spectrum shape distortion results in violation of transmission specifications.

The compensation effect generated by the regenerator compensator 223 is illustrated by comparing FIGS. 5A-5B to FIG. 5C. As shown, the output $O_3$ of the PLL frequency synthesizer $300_3$ is wider than the output $O_2$ of the PLL frequency synthesizer $300_2$ and resembles that of the output O1 of the PLL frequency synthesizer $300_1$, demonstrating that the distortion induced by the frequency regenerator 230 is compensated by the regenerator compensator 223. Resultingly, specifications on modulation index and more other spectrum characteristics can be satisfied.

Note that the operation sequence of the pulse shaping, the compensation for the distortion of the PLL 110, and the compensation for the distortion of the frequency regenerator 630 can be interchanged. For example, the regenerator compensator 223 can be disposed between the waveform generator 221 and the regenerator 223.

Figure 10:
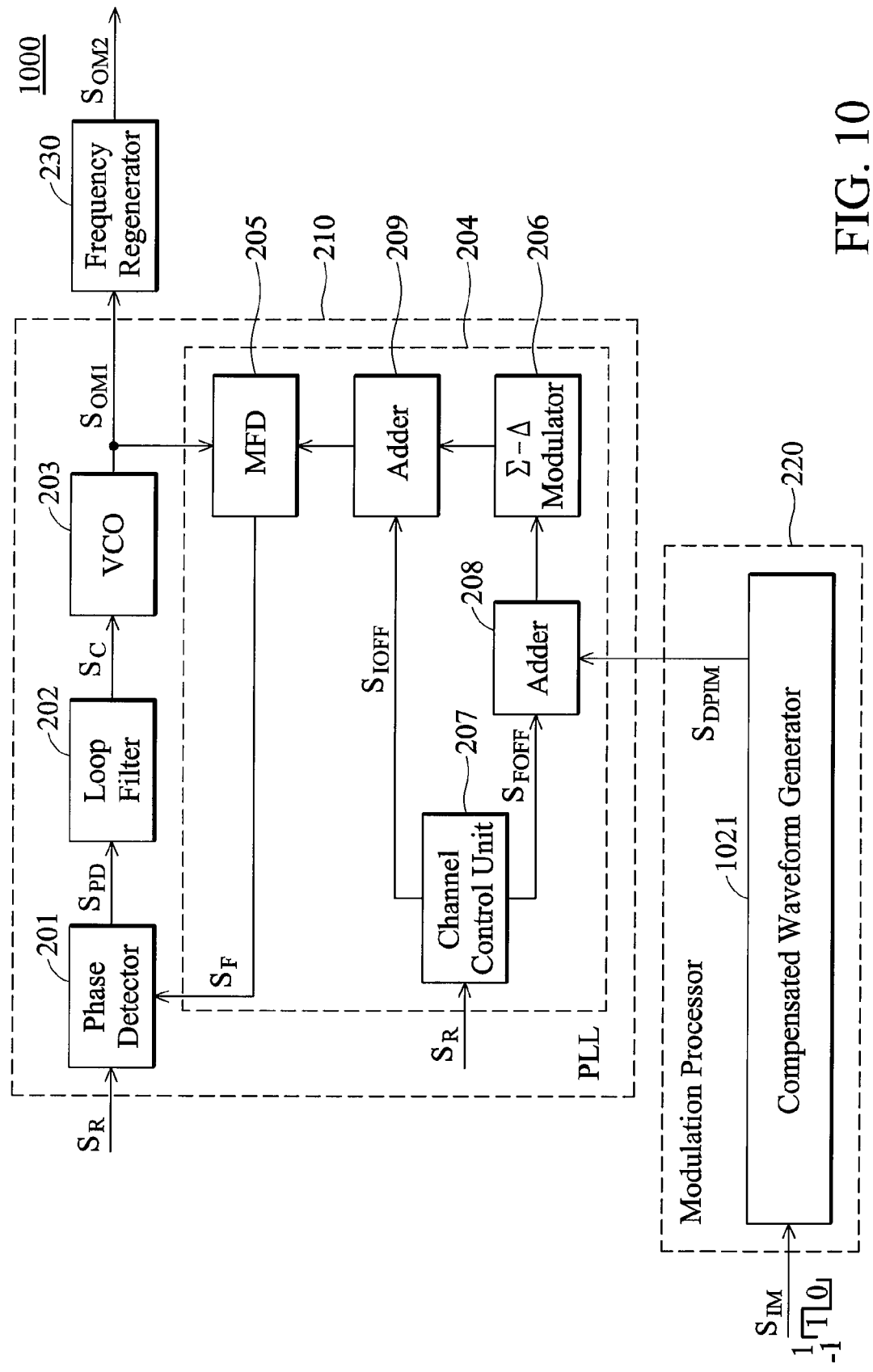
FIG. 10 illustrates a frequency response of the PLL compensator of FIG. 6 and a frequency response of the integrated compensator of FIG. 9.

In addition, any two or all of these operations can be combined for reducing component requirements. For example, the digital processing of the input modulation signal $S_{IM}$ can be implemented by adapting the waveform generator 221 such that its filter characteristic reflects the intended compensation for the distortion of the frequency regenerator 630 as well as enabling Gaussian Frequency Shift Keyed modulation. Alternatively, the digital processing of the input modulation signal $S_{IM}$ can be implemented by adapting the PLL compensator 222 such that its filter characteristic reflects the intended compensations for both the distortion of the frequency regenerator 230 and the PLL 210. Also alternatively, the digital processing of the input modulation signal SIM can be implemented by adapting the waveform generator 221 such that its filter characteristic reflects the intended compensations for the distortion of the frequency regenerator 630 and the PLL 210 as well as enables Gaussian Frequency Shift Keyed modulation. Modification of the waveform generator 221 or PLL compensator 222 to include the compensation frequency response of the regenerator compensator adds little complexity over that required for the original waveform generator 221 or PLL compensator 222. With any of these combining implementations, no additional components beyond the PLL system are needed to implement the compensation for the frequency regenerator 230 provided by the invention. Two such exemplary embodiments as illustrated in FIG. 6 and FIG. 10 follow.

Figure 6:
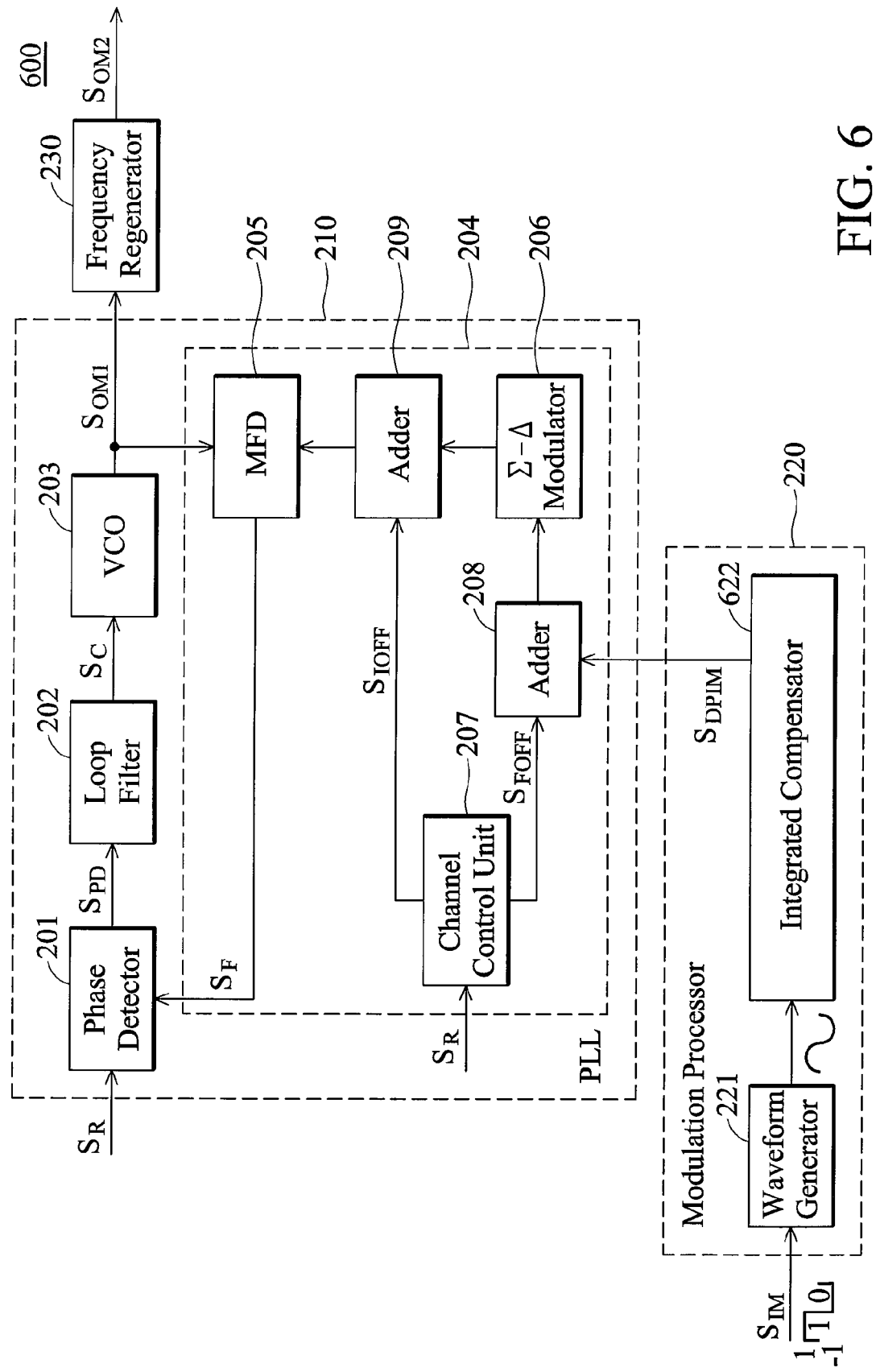
FIG. 6 is a block diagram of a phase locked loop frequency regenerator in accordance with an alternative embodiment of the invention.

FIG. 6 is a block diagram of a phase locked loop frequency regenerator 600 in accordance with an alternative embodiment of the invention, differing from the PLL frequency regenerator 200 only in that the PLL compensator 222 and the regenerator compensator 223 are combined into an integrated compensator 622. The original PLL compensator 222 is adapted to be the integrated compensator 622 with a frequency response of a convolution of frequency response $G_{PLLC}(f)$ of the original PLL compensator 222 with the frequency response $G_{REC}(f)$ of the original regenerator compensator 223 in FIG. 2. In an exemplary embodiment, the frequency regenerator 230 is a dividing-by-N frequency divider, and the integrated compensator 223 correspondingly has a frequency response of a convolution of frequency response $G_{PLLC}(f)$ of the PLL compensator 222 with a frequency response corresponding to a multiplying-by-N operation. In another exemplary embodiment, the frequency regenerator 230 is a multiplying-by-N frequency multiplier, and the integrated compensator 223 correspondingly has a frequency response of a convolution of frequency response $G_{PLLC}(f)$ of the PLL compensator 222 with a frequency response corresponding to a dividing-by-N operation. With the implementation of the integrated compensator 622, the compensation for the frequency regenerator 230 of the invention does not require any additional analog or digital regenerator compensation components.

Figure 7:
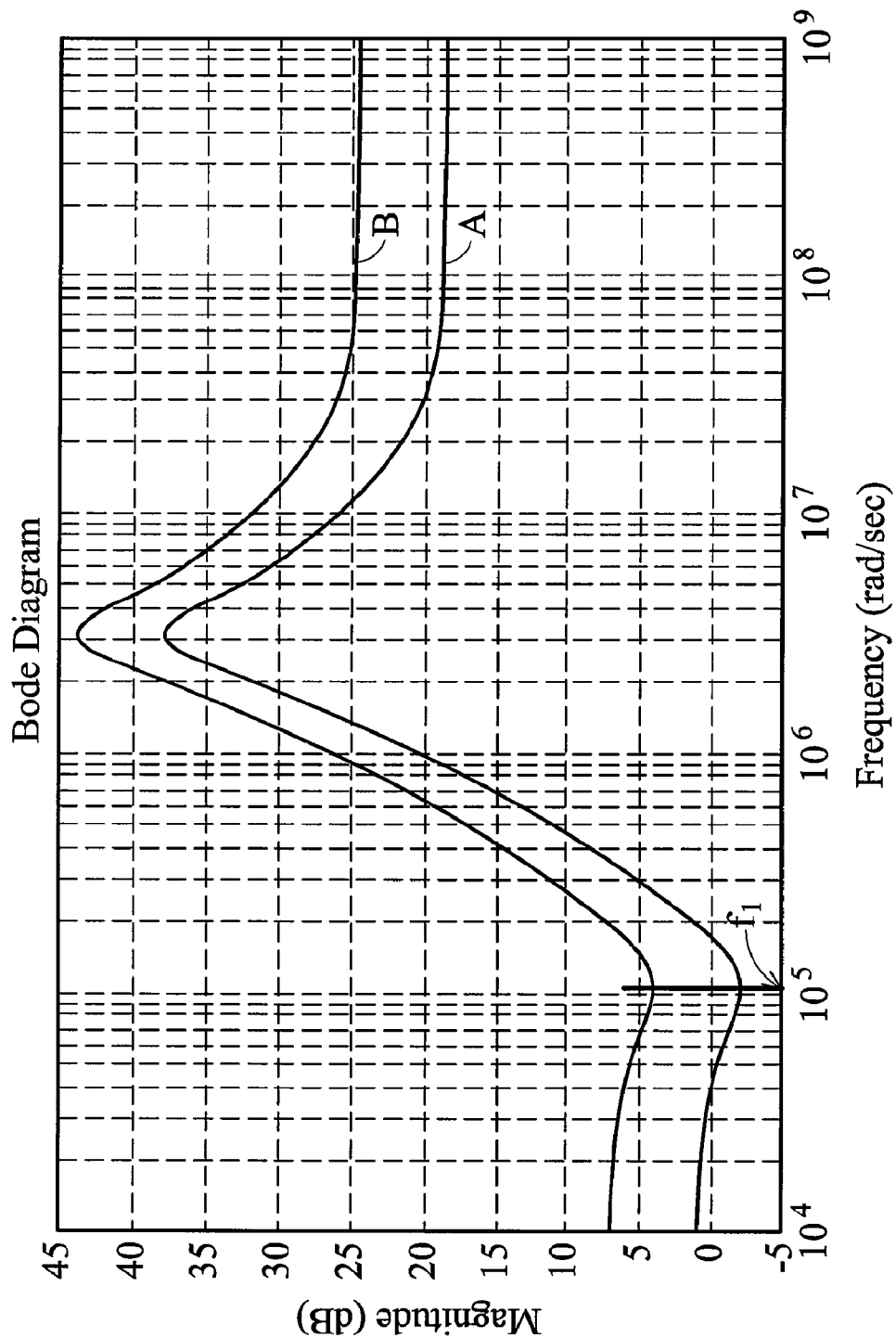
FIG. 7 illustrates the frequency response of the integrated compensator of FIG. 6.

FIG. 7 illustrates the resulting combined frequency response of the integrated compensator 622 of FIG. 6, wherein the frequency regenerator 223 is implemented as a dividing-by-2 divider as in FIG. 3C. The frequency response of the integrated compensator 622, shown with curve B, is produced by convolution of the frequency response $G_{PLLC}(f)$ of the PLL compensator 222 (shown with curve A) with the frequency response $G_{REC}(f)$ of the regenerator compensator 223, wherein $G_{PLLC}(f)$ of the PLL compensator 223 corresponds to amplifying operation at frequencies higher than a cutoff frequency $f_1$ at about $10^5$ rad/sec, and the frequency response $G_{REC}(F)$ corresponds multiplying-by-2 operation.

Figure 8:
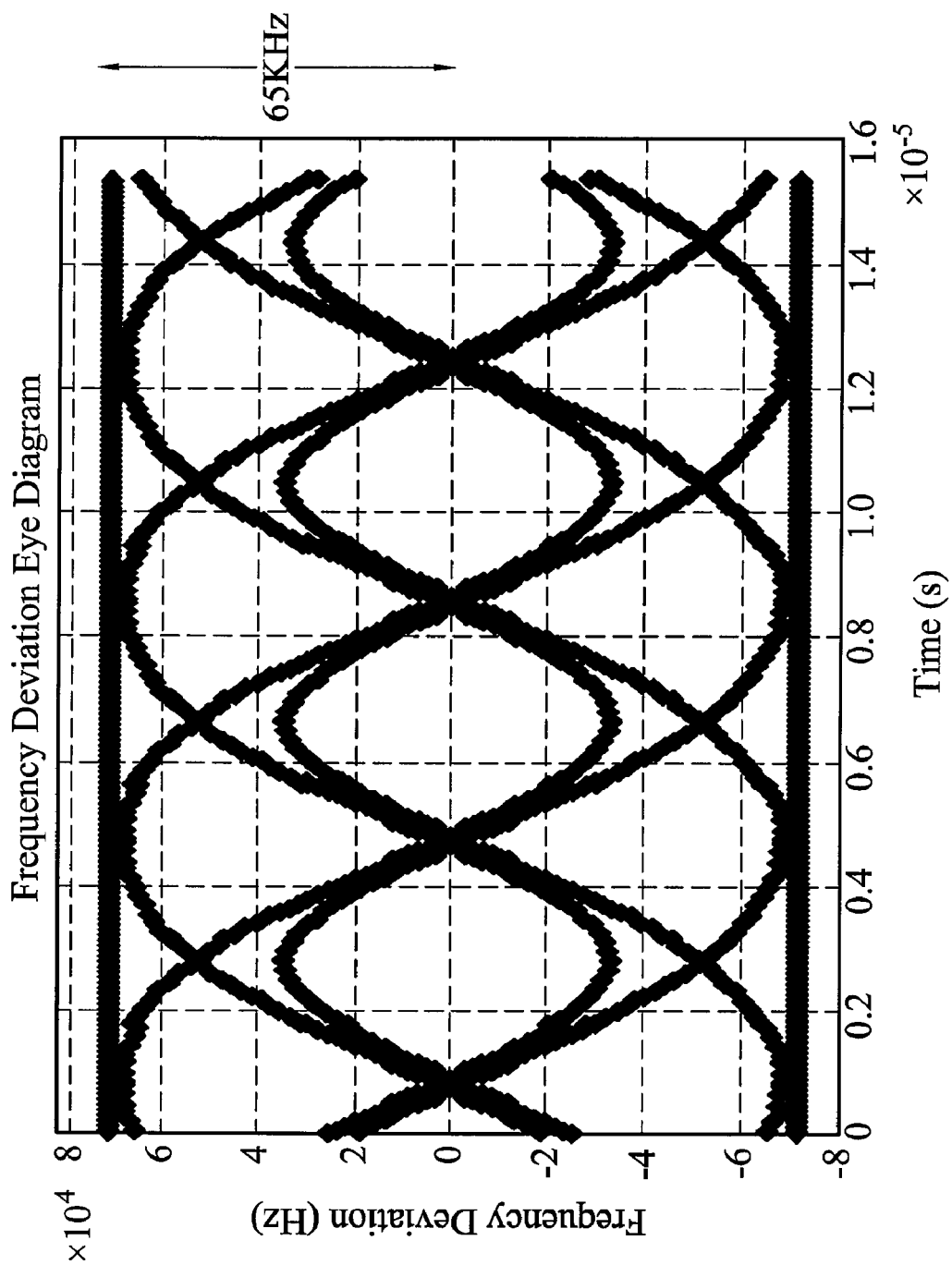
FIG. 8 is an eye diagram of the PLL frequency synthesizer of FIG. 6.

FIG. 8 is an eye diagram for the second output modulation signal $S_{OM2}$ of the PLL frequency synthesizer 600 in the same exemplary case as FIGS. 3C and 7 where a dividing-by-2 frequency divider is implemented as the frequency regenerator 230. As shown, the maximum frequency deviation is 65 KHz, demonstrating that the modulation index is recovered. In addition, both the vertical and horizontal expanses in FIG. 8 are less than those in FIG. 4B, indicating better immunity to noise and timing phase errors with the implementation of the integrated compensator 622.

Figure 9:
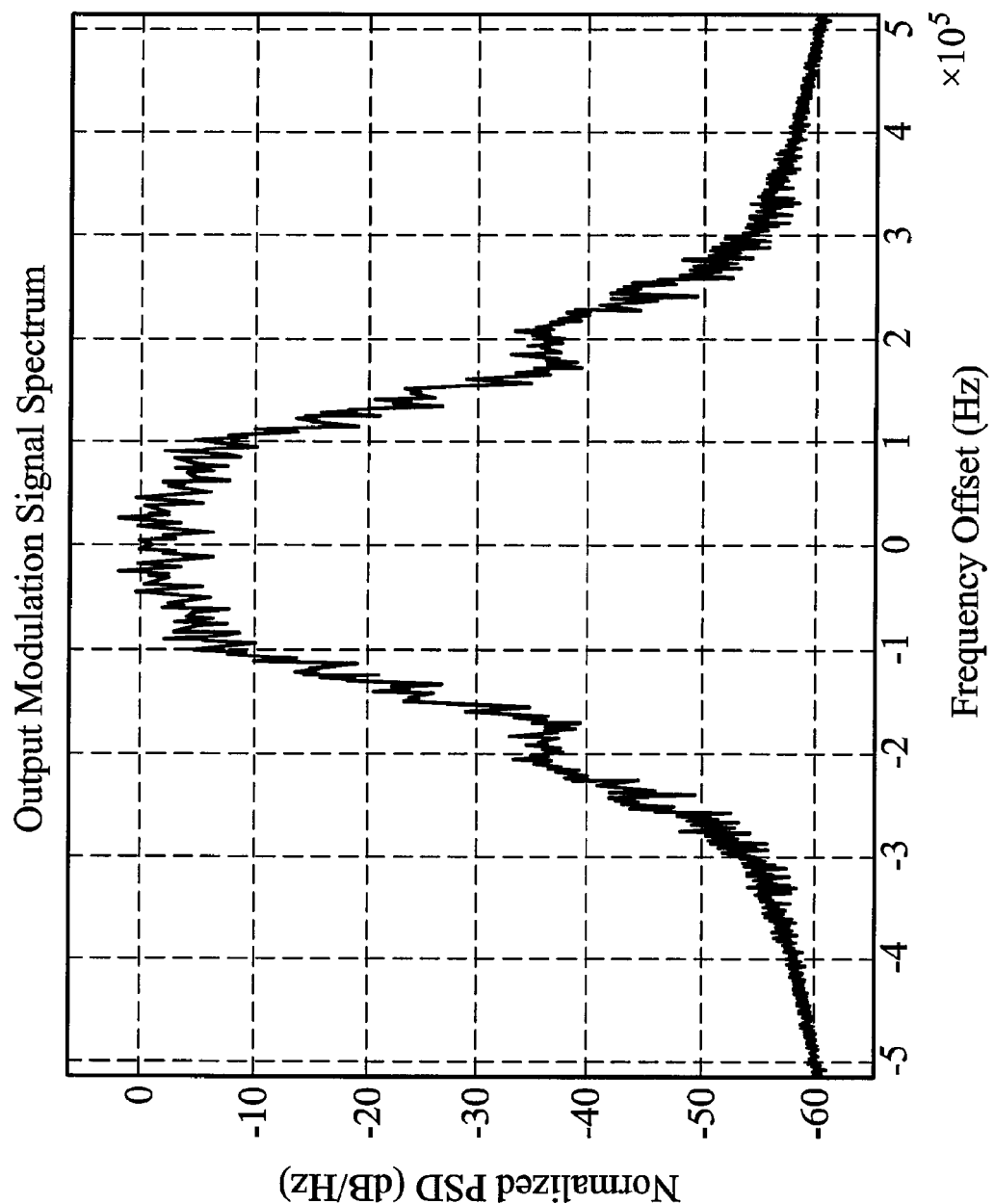
FIG. 9 is an output spectral measurement diagram of the PLL frequency synthesizer of FIG. 6.

FIG. 9 is a spectral measurement diagram for the second output modulation signal $S_{OM2}$ of the PLL frequency synthesizer 600 in the same exemplary case as FIG. 8. As shown, the spectrum of the second output modulation signal $S_{OM2}$ of the PLL frequency synthesizer 900 resembles that of the output $O_1$ of the PLL frequency synthesizer $300_1$ in FIG. 3A, reflecting that the modulation index distortion is compensated with the implementation of the integrated compensator 622.

FIG. 10 is a block diagram of a phase locked loop frequency regenerator 1000 in accordance with another alternative embodiment of the invention, differing from the PLL frequency regenerator 200 only in that the waveform generator 221, the PLL compensator 222 and the regenerator compensator 223 are combined into a compensated waveform generator 1021. The original waveform generator 221 is adapted to be the compensated waveform generator 1021 that has a frequency response of a convolution of the Gaussian frequency response $G_{WG}(f)$ of the original waveform generator 221 with the frequency response $G_{PLLC}(f)$ of the original PLL compensator 222 and the frequency response $G_{REC}(f)$ of the original regenerator compensator 223 in FIG. 2. In an exemplary embodiment, the frequency regenerator 230 is a dividing-by-N frequency divider, and the compensated waveform generator 1021 correspondingly has a frequency response of a convolution of the Gaussian frequency response $G_{WG}(F)$ of the original waveform generator 221 with the frequency response $G_{PLLC}(f)$ of the original PLL compensator 222 and a frequency response corresponding to a multiplying-by-N operation. In another exemplary embodiment, the frequency regenerator 230 is a multiplying-by-N frequency multiplier, and compensated waveform generator 1021 correspondingly has a frequency response of a convolution of the Gaussian frequency response $G_{WG}(f)$ of the original waveform generator 221 with the frequency response $G_{PLLC}(f)$ of the original PLL compensator 222 and a frequency response corresponding to a dividing-by-N operation. With the implementation of the compensated waveform generator 1021, not only the compensation for the frequency regenerator 230 provided by the invention but also the compensation for the PLL 210 do not require any additional analog or digital regenerator compensation components.

Figure 11:
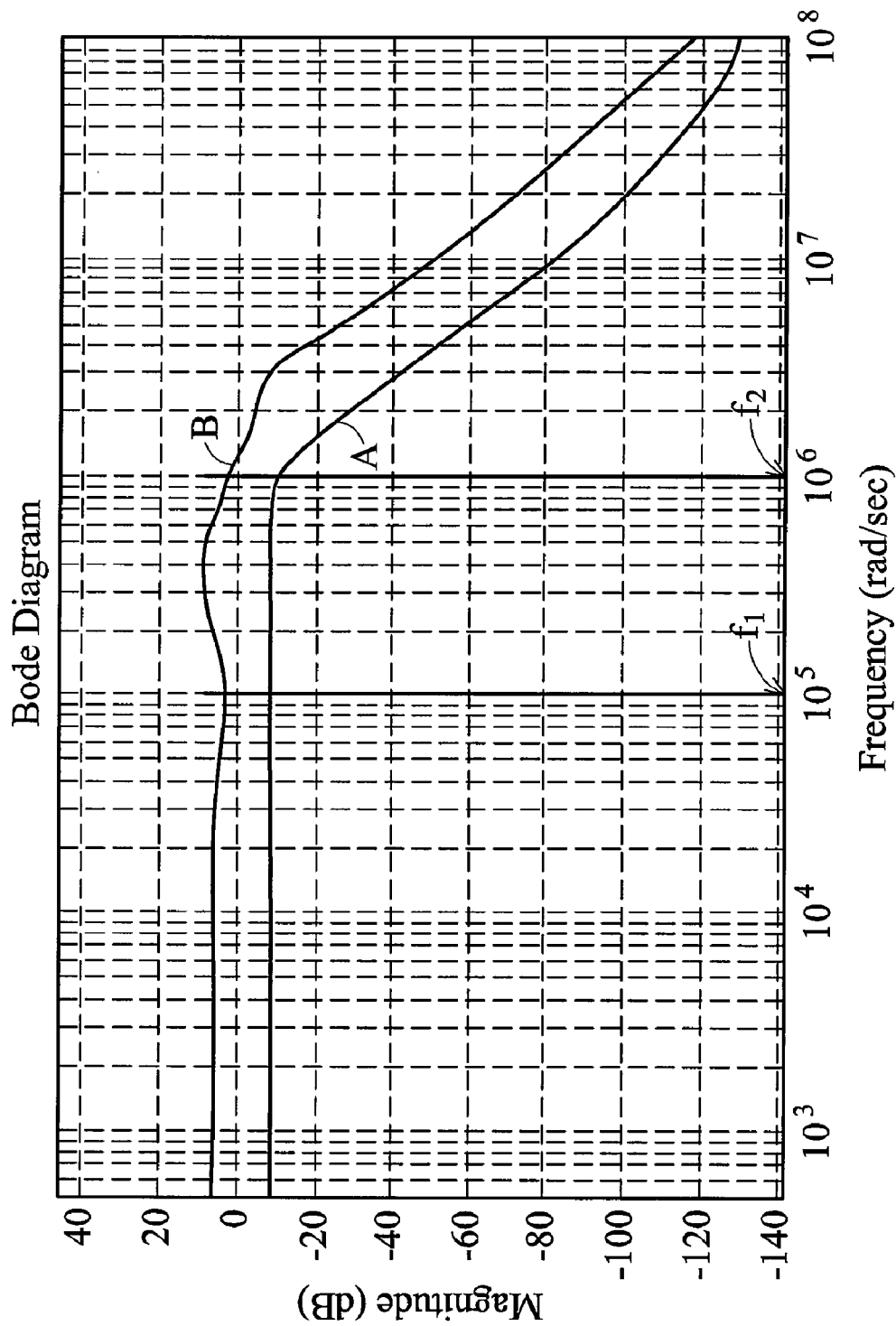
FIG. 11 illustrates the frequency response of the compensated waveform generator of FIG. 10.

FIG. 11 illustrates the resulting combined frequency response of compensated waveform generator 1021 of FIG. 10, wherein the frequency regenerator 223 is implemented as a dividing-by-2 divider as in FIG. 3C. The frequency response of compensated waveform generator 1021, shown with curve B, is produced by convolution of the Gaussian frequency response $G_{WG}(f)$ of the waveform generator 221 (shown with curve A) with the frequency response $G_{PLLC}(f)$ of the PLL compensator 222 (shown with curve A in FIG. 7) and the frequency response $G_{REC}(f)$ of the regenerator compensator 223, wherein the Gaussian frequency response $G_{WG}(f)$ of the waveform generator 221 is characterized by a cutoff frequency $f_2$ at about $10_6$ rad/sec, the frequency response $G_{PLLC}(f)$ of the PLL compensator 223 corresponds to amplifying operation at frequencies higher than the cutoff frequency $f_1$ at about $10^5$ rad/sec, and the frequency response $G_{REC}(f)$ corresponds multiplying-by-2 operation as mentioned.

Figure 12:
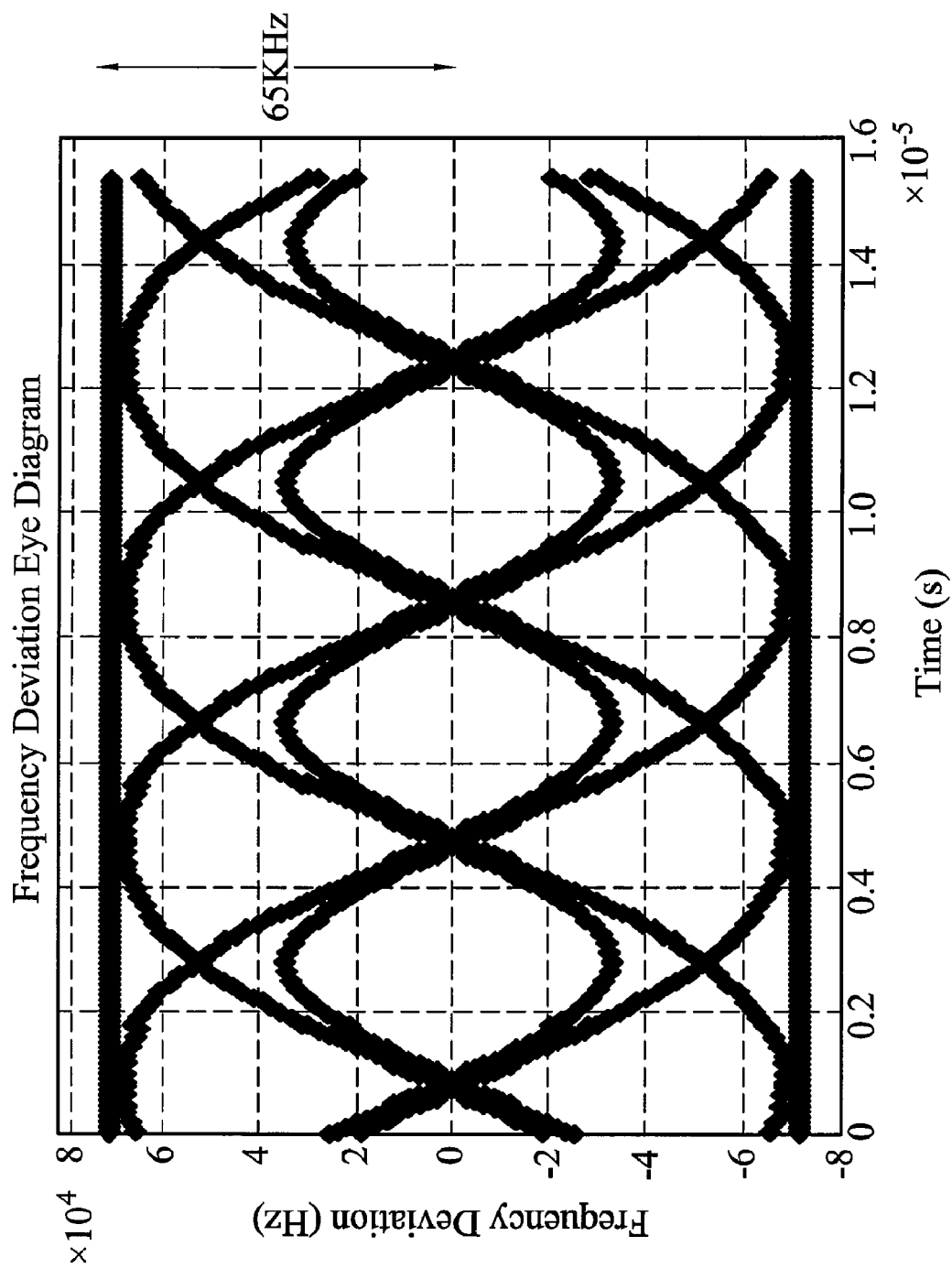
FIG. 12 is an eye diagram of the PLL frequency synthesizer of FIG. 10.

FIG. 12 is an eye diagram for the second output modulation signal $S_{OM2}$ of the PLL frequency synthesizer 1000 in the same exemplary case as FIGS. 3C and 11 where a dividing-by-2 frequency divider is implemented as the frequency regenerator 230. As shown, the maximum frequency deviation is 65 KHz, demonstrating that the modulation index is recovered. In addition, both the vertical and horizontal expanses in FIG. 12 are less than those in FIG. 4B, indicating better immunity to noise and timing phase errors with the implementation of the compensated waveform generator 1021.

Figure 13:
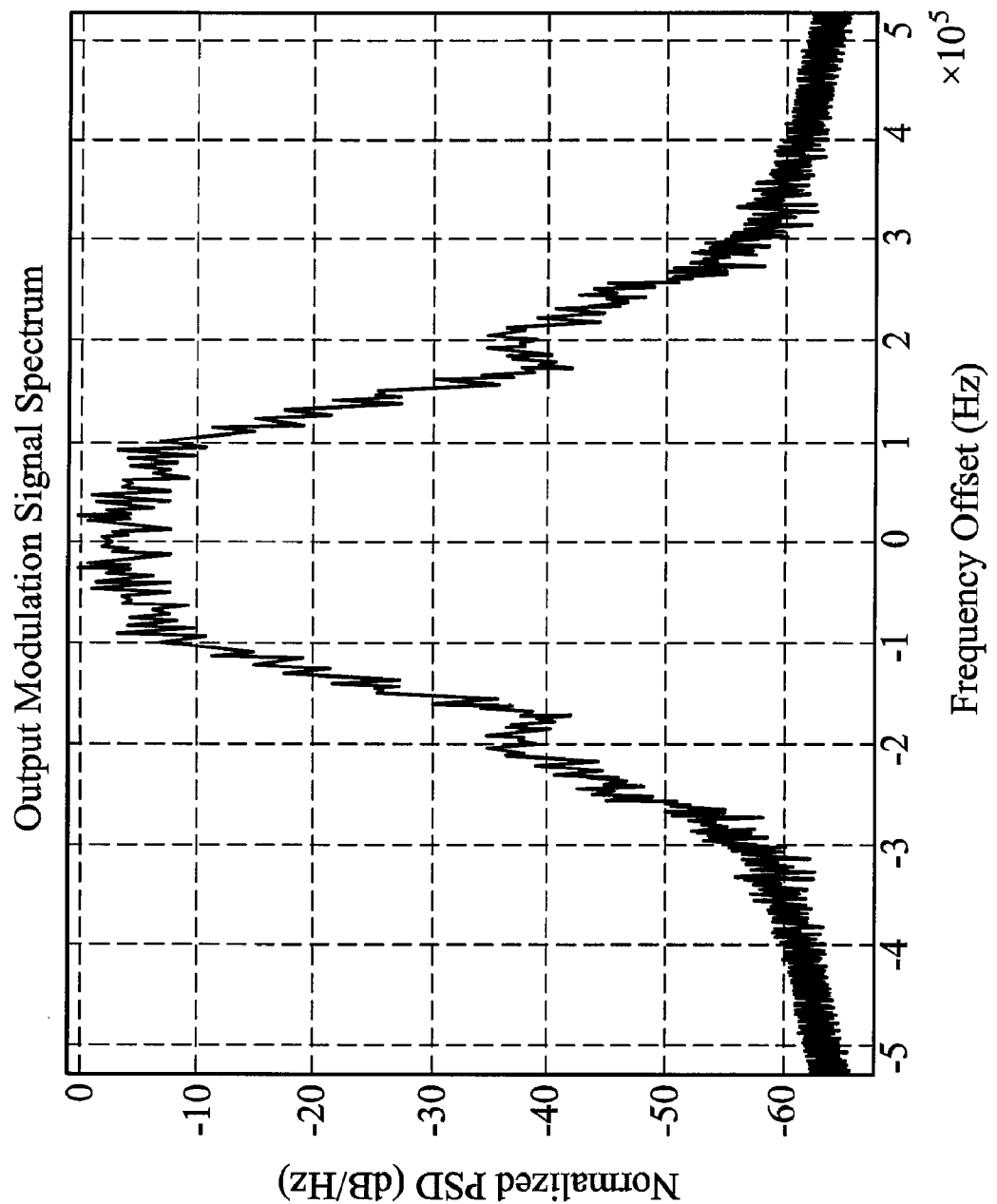
FIG. 13 is an output spectral measurement diagram of the PLL frequency synthesizer of FIG. 10.

FIG. 13 is a spectral measurement diagram for the second output modulation signal $S_{OM2}$ of the PLL frequency synthesizer 1000 in the same exemplary case as FIG. 12. As shown, the spectrum of the second output modulation signal $S_{OM2}$ of the PLL frequency synthesizer 1000 resembles that of the output $O_1$ of the PLL frequency synthesizer 300$_1$ in FIG. 3A, reflecting that the modulation index distortion is compensated with the implementation of the compensated waveform generator 1021.

It is noted that there have been developed various PLL frequency synthesizers employing diverse modulations, and the compensation for the distortion induced by frequency regenerator provided by the invention is not limited to the modulation described the embodiments. For example, all of the embodiments shown in FIGS. 2, 6 and 10 employ one-point modulation. That is, the modulation processor 220 provides only the digitally processed input modulation signal $S_{DPIM}$ to modulate the PLL 210. However, the invention is not limited to application with one-point modulation only, and can be applied to more point modulations, such as two-point modulation.

Figure 14:
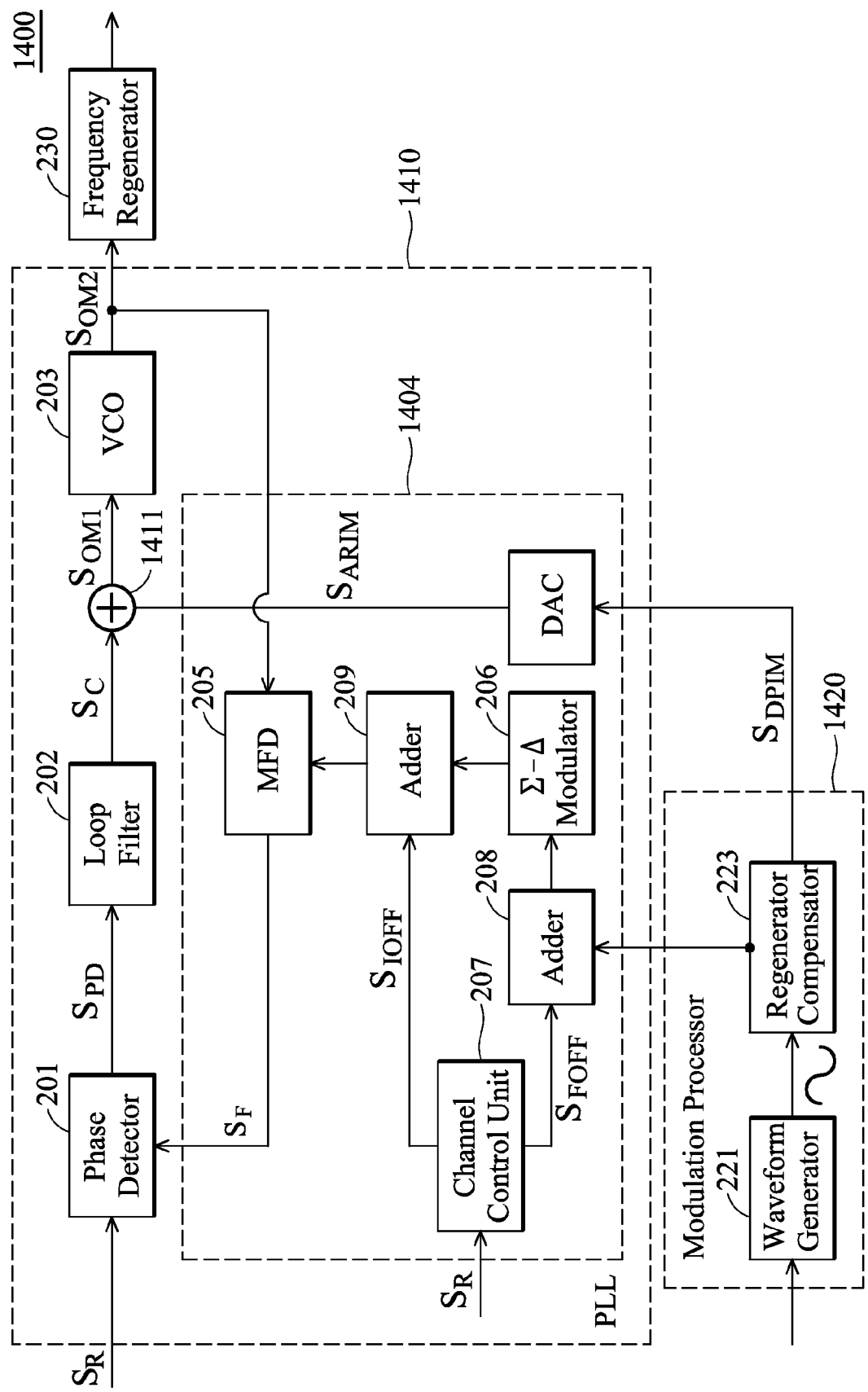
FIG. 14 is a block diagram of a phase locked loop frequency synthesizer employing two-point modulation in accordance with an embodiment of the invention.

FIG. 14 is a block diagram of a phase locked loop frequency synthesizer 1400 employing two-point modulation in accordance with an embodiment of the invention. The PLL frequency synthesizer 1400 has similar structures to the PLL frequency synthesizer 200, differing only in that the modulation processor 220 is replaced with a modulation processor 1420 where the PLL compensator 222 is removed. In addition, the PLL 210 is replaced with a PLL 1410. PLL 1410 has similar structures to the PLL 210, differing only in that the frequency driving circuit 204 is replaced with a frequency driving circuit 1404 which further converts the digitally processed input modulation signal $S_{DPIM}$ to an analog processed input modulation signal $S_{APIM}$ used for compensation for the limited bandwidth of the PLL 210. The analog processed input modulation signal $S_{APIM}$ is injected into an adder 1411 situated in the forward path of the PLL 1410 and is preferably connected upstream of the VOC 203 as shown in the figure. The analog processed input modulation signal $S_{APIM}$ fed in the adder 1411 has a high-pass filtering effect on the first output modulation signal $S_{OM1}$ output by the PLL 1410 on account of the closed control loop. In contrast, the driving frequency dividing unit 1404 where the digitally processed input modulation signal $S_{DPIM}$ is fed represents a point in the PLL 1410 at which a low-pass response results for injecting modulation. The digital and analogue processed input modulation signals $S_{DPIM}$ and $S_{APIM}$ are superimposed at the output of the PLL 1410, resulting in the PLL 1410 comprising a frequency-independent transmission response. Accordingly, the PLL 1410 can be modulated with the input modulation signal $S_{IMP}$ with bandwidth exceeding that of the PLL 1410.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A phase locked loop frequency synthesizer, comprising:
   a phase locked loop comprising:
      a detector receiving a reference signal and a feedback signal to generate a phase detection signal based on phase difference therebetween;
      a loop filter filtering the phase detection signal to generate a control signal;
      a voltage control oscillator generating a first output modulation signal with a frequency varying based on the control signal; and
      a frequency dividing unit varying a division factor based on a processed input modulation signal and dividing the frequency of the first output modulation signal by the division factor to generate the feedback signal;
   a frequency regenerator altering the frequency of first output modulation signal to generate a second output modulation signal with a frequency range not overlapping an output frequency range of the voltage control oscillator; and
   a modulation processor processing an input modulation signal to generate the processed input modulation signal to adjust the division factor of the frequency dividing unit, wherein the processing of the input modulation signal comprises compensating for distortion induced by the frequency regenerator,
   wherein the modulation processor comprises:
      a waveform generator performing pulse shaping on the input modulation signal;
   and
      a compensator compensating for distortion induced by the frequency regenerator.

2. The phase locked loop frequency synthesizer as claimed in claim 1, wherein the modulation processor compensates for modulation index distortion of the second output modulation signal induced by the frequency regenerator.

3. The phase locked loop frequency synthesizer as claimed in claim 1, wherein the waveform generator is implemented by a filter with a modulation frequency response.

4. The phase locked loop frequency synthesizer as claimed in claim 1, wherein the compensator has a frequency response determined according to the inverse of a frequency response of the frequency regenerator.

5. The phase locked loop frequency synthesizer as claimed in claim 4, wherein the frequency regenerator is a frequency divider with a division factor, and the compensator comprises a frequency multiplier with a multiplication factor equal to the inverse of the division factor of the frequency divider.

6. The phase locked loop frequency synthesizer as claimed in claim 4, wherein the frequency regenerator is a frequency multiplier with a multiplication factor, and the compensator comprises a frequency divider with a division factor equal to the inverse of the multiplication factor of the frequency multiplier.

7. The phase locked loop frequency synthesizer as claimed in claim 3, wherein the modulation processor further compensates for distortion induced by the phase locked loop.

8. The phase locked loop frequency synthesizer as claimed in claim 7, wherein the modulation processor further comprises a second compensator compensating for the distortion induced by the phase locked loop.

9. The phase locked loop frequency synthesizer as claimed in claim 7, wherein the compensator further compensates for the distortion induced by the phase locked loop and has a first frequency response produced of a convolution of second and third frequency responses respectively corresponding to compensation for the distortion induced by the frequency regenerator and compensation for the distortion induced by the phase locked loop.

10. The phase locked loop frequency synthesizer as claimed in claim 9, wherein the second frequency response is determined according to the inverse of a frequency response of the frequency regenerator.

11. The phase locked loop frequency synthesizer as claimed in claim 10, wherein the frequency regenerator is a frequency divider with a division factor, and the second frequency response corresponds to multiplication with a multiplication factor equal to the inverse of the division factor of the frequency divider.

12. The phase locked loop frequency synthesizer as claimed in claim 10, wherein the frequency regenerator is a frequency multiplier with a multiplication factor, and the second frequency response corresponds to division with a division factor equal to the inverse of the multiplication factor of the frequency multiplier.

13. The phase locked loop frequency synthesizer as claimed in claim 1, wherein the modulation processor comprises a compensated waveform generator for performing pulse shaping on the input modulation signal and compensating for distortion induced by the frequency regenerator.

14. The phase locked loop frequency synthesizer as claimed in claim 13, wherein the compensated waveform generator has a first frequency response of a convolution of second and third frequency responses respectively corresponding to pulse shaping on the input modulation signal and compensation for the distortion induced by the frequency regenerator.

15. The phase locked loop frequency synthesizer as claimed in claim 14, wherein the third frequency response is determined according to the inverse of a frequency response of the frequency regenerator.

16. The phase locked loop frequency synthesizer as claimed in claim 15, wherein the frequency regenerator is a frequency divider with a division factor, and the third frequency response corresponds to multiplication with a multiplication factor equal to the inverse of the division factor of the frequency divider.

17. The phase locked loop frequency synthesizer as claimed in claim 15, wherein the frequency regenerator is a frequency multiplier with a multiplication factor, and the third frequency response corresponds to division with a division factor equal to the inverse of the multiplication factor of the frequency multiplier.

18. The phase locked loop frequency synthesizer as claimed in claim 13, wherein the modulation processor further compensates for distortion induced by the phase locked loop.

19. The phase locked loop frequency synthesizer as claimed in claim 18, wherein the modulation processor further comprises a compensator compensating for distortion induced by the phase locked loop.

20. The phase locked loop frequency synthesizer as claimed in claim 18, wherein the compensated waveform generator further compensates for distortion induced by the phase locked loop and has a first frequency response of convolution of second, third and forth frequency responses respectively corresponding to pulse shaping on the input modulation signal, compensation for the distortion induced by the phase locked loop, and compensation for the distortion induced by the frequency regenerator.

21. The phase locked loop frequency synthesizer as claimed in claim 20, wherein the fourth frequency response is determined according to the inverse of a frequency response of the frequency regenerator.

22. The phase locked loop frequency synthesizer as claimed in claim 21, wherein the frequency regenerator is a frequency divider with a division factor, and the fourth frequency response corresponds to multiplication with a multiplication factor equal to the inverse of the division factor of the frequency divider.

23. The phase locked loop frequency synthesizer as claimed in claim 21, wherein the frequency regenerator is a frequency multiplier with a multiplication factor, and the fourth frequency response corresponds to division with a division factor equal to the inverse of the multiplication factor of the frequency multiplier.

24. The phase locked loop frequency synthesizer as claimed in claim 1, wherein the dividing module comprises:
   a multi-modulus frequency divider varying the division factor according to a division factor control signal and dividing the frequency of the first output modulation signal by the division factor to generate the feedback signal; and
   an $\Sigma$-$\Delta$ modulator generating the division factor control signal according to the processed input modulation signal.

25. The phase locked loop frequency synthesizer as claimed in claim 1, wherein a channel selection is performed by adding an offset to the processed input modulation signal.

26. A phase locked loop frequency synthesizer, comprising:
   a phase locked loop comprising:
      a detector receiving a reference signal and a feedback signal to generate a phase detection signal based on phase difference therebetween;
      a loop filter filtering the phase detection signal to generate a control signal;
      a voltage control oscillator generating a first output modulation signal with a frequency varying based on the control signal; and
      a frequency dividing unit varying a division factor based on a processed input modulation signal and dividing the frequency of the first output modulation signal by the division factor to generate the feedback signal;
   a frequency regenerator altering the frequency of first output modulation signal to generate a second output modulation signal with a frequency range not overlapping an output frequency range of the voltage control oscillator; and
   a modulation processor processing an input modulation signal to generate the processed input modulation signal to adjust the division factor of the frequency dividing unit, wherein the processing of the input modulation signal comprises compensating for distortion induced by the frequency regenerator,
   wherein the frequency dividing module further converts the processed input modulation signal to an analog processed input modulation signal to compensate for distortion induced by the phase locked loop, and
   the phase locked loop further comprises an adder comprising an input coupled to the analog processed input modulation signal.

27. The phase locked loop frequency synthesizer as claimed in claim 26, wherein the adder further comprises another input coupled to the control signal and an output coupled to the voltage control oscillator.

28. Apparatus for modulating a phase locked loop coupled to a frequency generator, the phased locked loop comprising a detector receiving a reference signal and a feedback signal to generate a phase detection signal based on phase difference therebetween; a loop filter filtering the phase detection signal to generate a control signal; a voltage control oscillator generating a first output modulation signal with a frequency varying based on the control signal; and a frequency dividing unit varying a division factor based on a processed input modulation signal and dividing the frequency of the first output modulation signal by a division factor to generate the feedback signal; the frequency regenerator altering the frequency of first output modulation signal to generate a second output modulation signal with a frequency range not overlapping an output frequency range of the voltage control oscillator; the apparatus comprising a modulation processor processing an input modulation signal to generate the processed input modulation signal to adjust the division factor of the frequency dividing unit, wherein the processing of the input modulation signal comprises compensating for distortion induced by the frequency regenerator; wherein the modulation processor comprises a waveform generator performing pulse shaping on the input modulation signal; and a compensator compensating for distortion induced by the frequency regenerator.

29. The apparatus as claimed in claim 28, wherein the modulation processor compensates for modulation index distortion of the second output modulation signal induced by the frequency regenerator.

30. The apparatus as claimed in claim 28, wherein the waveform generator is implemented by a filter with a modulation frequency response.

31. The apparatus as claimed in claim 28, wherein the compensator has a frequency response determined according to the inverse of a frequency response of the frequency regenerator.

32. The apparatus as claimed in claim 31, wherein the frequency regenerator is a frequency divider with a division factor, and the compensator comprises a frequency multiplier with a multiplication factor equal to the inverse of the division factor of the frequency divider.

33. The apparatus as claimed in claim 31, wherein the frequency regenerator is a frequency multiplier with a multiplication factor, and the compensator comprises a frequency divider with a division factor equal to the inverse of the multiplication factor of the frequency multiplier.

34. The apparatus as claimed in claim 31, wherein the modulation processor further compensates for distortion induced by the phase locked loop.

35. The apparatus as claimed in claim 34, wherein the modulation processor further comprises a second compensator compensating for the distortion induced by the phase locked loop.

36. The apparatus as claimed in claim 34, wherein the compensator further compensates for the distortion induced by the phase locked loop and has a first frequency response produced as a convolution of second and third frequency responses respectively corresponding to compensation for the distortion induced by the frequency regenerator and compensation for the distortion induced by the phase locked loop.

37. The apparatus as claimed in claim 36, wherein the second frequency response is determined according to the inverse of a frequency response of the frequency regenerator.

38. The apparatus as claimed in claim 37, wherein the frequency regenerator is a frequency divider with a division factor, and the second frequency response corresponds to multiplication with a multiplication factor equal to the inverse of the division factor of the frequency divider.

39. The apparatus as claimed in claim 37, wherein the frequency regenerator is a frequency multiplier with a multiplication factor, and the second frequency response corresponds to division with a division factor equal to the inverse of the multiplication factor of the frequency multiplier.

40. The apparatus as claimed in claim 28, wherein the compensated waveform generator has a first frequency response of a convolution of second and third frequency responses respectively corresponding to pulse shaping on the input modulation signal and compensation for the distortion induced by the frequency regenerator.

41. The apparatus as claimed in claim 40, wherein the third frequency response is determined according to the inverse of a frequency response of the frequency regenerator.

42. The apparatus as claimed in claim 41, wherein the frequency regenerator is a frequency divider with a division factor, and the third frequency response corresponds to multiplication with a multiplication factor equal to the inverse of the division factor of the frequency divider.

43. The apparatus as claimed in claim 41, wherein the frequency regenerator is a frequency multiplier with a multiplication factor, and the third frequency response corresponds to division with a division factor equal to the inverse of the multiplication factor of the frequency multiplier.

44. The apparatus as claimed in claim 28, wherein the modulation processor further compensates for distortion induced by the phase locked loop.

45. The apparatus as claimed in claim 44, wherein the modulation processor further comprises a compensator compensating for distortion induced by the phase locked loop.

46. The apparatus as claimed in claim 44, wherein the compensated waveform generator further compensates for distortion induced by the phase locked loop and has a first frequency response of convolution of second, third and forth frequency responses respectively corresponding to pulse shaping on the input modulation signal, compensation for the distortion induced by the phase locked loop, and compensation for the distortion induced by the frequency regenerator.

47. The apparatus as claimed in claim 46, wherein the fourth frequency response is determined according to the inverse of a frequency response of the frequency regenerator.

48. The apparatus as claimed in claim 47, wherein the frequency regenerator is a frequency divider with a division factor, and the fourth frequency response corresponds to multiplication with a multiplication factor equal to the inverse of the division factor of the frequency divider.

49. The apparatus as claimed in claim 47, wherein the frequency regenerator is a frequency multiplier with a multiplication factor, and the fourth frequency response corresponds to division with a division factor equal to the inverse of the multiplication factor of the frequency multiplier.

50. The apparatus as claimed in claim 28, wherein the dividing module comprises:
a multi-modulus frequency divider varying the division factor according to a division factor control signal and dividing the frequency of the first output modulation signal by the division factor to generate the feedback signal; and
an $\Sigma\text{-}\Delta$ modulator generating the division factor control signal according to the processed input modulation signal.

51. The apparatus as claimed in claim 28, wherein a channel selection is performed by adding an offset to the processed input modulation signal.

52. Apparatus for modulating a phase locked loop coupled to a frequency generator, the phased locked loop comprising a detector receiving a reference signal and a feedback signal to generate a phase detection signal based on phase difference therebetween; a loop filter filtering the phase detection signal to generate a control signal; a voltage control oscillator generating a first output modulation signal with a frequency varying based on the control signal; and a frequency dividing unit varying a division factor based on a processed input modulation signal and dividing the frequency of the first output modulation signal by a division factor to generate the feedback signal; the frequency regenerator altering the frequency of first output modulation signal to generate a second output modulation signal with a frequency range not overlapping an output frequency range of the voltage control oscillator; the apparatus comprising a modulation processor processing an input modulation signal to generate the processed input modulation signal to adjust the division factor of the frequency dividing unit, wherein the processing of the input modulation signal comprises compensating for distortion induced by the frequency regenerator, wherein
- the frequency dividing module further converts the processed input modulation signal to an analog processed input modulation signal to compensate for distortion induced by the phase locked loop, and
- the phase locked loop further comprises an adder comprising an input coupled to the analog processed input modulation signal.

53. The apparatus as claimed in claim 52, wherein the adder further comprises another input coupled to the control signal and an output coupled to the voltage control oscillator.

54. A method for modulating a phase locked loop coupled to a frequency generator, the phased locked loop comprising a detector receiving a reference signal and a feedback signal to generate a phase detection signal based on phase difference therebetween; a loop filter filtering the phase detection signal to generate a control signal; a voltage control oscillator generating a first output modulation signal with a frequency varying based on the control signal; and a frequency dividing unit varying a division factor based on a processed input modulation signal dividing the frequency of the first output modulation signal by a division factor to generate the feedback signal; the frequency regenerator altering the frequency of first output modulation signal to generate a second output modulation signal with a frequency range not overlapping an output frequency range of the voltage control oscillator; the method comprising:
- receiving an input modulation signal;
- processing the input modulation signal to generate a processed input modulation signal to adjust the division factor of the frequency dividing unit, wherein processing of the input modulation signal comprises compensating for distortion induced by the frequency regenerator; and
- modulating the frequency dividing unit of the phase locked loop according to the processed input modulation signal;
- wherein processing of the input modulation signal further comprises performing pulse shaping on the input modulation signal.

55. The method as claimed in claim 54, wherein compensation for the distortion induced by the frequency regenerator comprises compensating for modulation index distortion of the second output modulation signal induced by the frequency regenerator.

56. The method as claimed in claim 54, wherein the step of performing pulse shaping is implemented by a filter with a modulation frequency response.

57. The method as claimed in claim 54, wherein the frequency regenerator is a frequency divider with a division factor, and compensation for distortion induced by the frequency regenerator comprises multiplication with a multiplication factor substantially equal to the inverse of the division factor of the frequency divider.

58. The method as claimed in claim 54, wherein the frequency regenerator is a frequency multiplier with a multiplication factor, and compensation for distortion induced by the frequency regenerator comprises a division operation with a division factor substantially equal to the inverse of the multiplication factor of the frequency multiplier.

59. The method as claimed in claim 54, wherein processing of the input modulation signal comprises first and second operations based on first and second frequency responses, wherein the first and second operations respectively correspond to pulse shaping on the input modulation signal and compensation for the distortion induced by the frequency regenerator.

60. The method as claimed in claim 54, wherein the second frequency response is determined according to the inverse of a frequency response of the frequency regenerator, wherein processing of the input modulation signal comprises an operation based on a first frequency response of a convolution of second and third frequency responses respectively corresponding to pulse shaping on the input modulation signal and compensation for the distortion induced by the frequency regenerator.

61. The method frequency synthesizer as claimed in claim 54, wherein processing of the input modulation signal further comprises compensating for distortion induced by the phase locked loop.

62. The method as claimed in claim 61, wherein processing of the input modulation signal comprises first, second, and third operations respectively based on first, second and third frequency responses, wherein the first, second and third frequency responses respectively correspond to pulse shaping on the input modulation signal, compensation for the distortion induced by the phase locked loop and compensation for the distortion induced by the frequency regenerator.

63. The method as claimed in claim 61, wherein processing of the input modulation signal comprises first and second operations respectively based on first and second frequency responses, wherein the first frequency response is a convolution of two of third, fourth and fifth frequency responses, and the second frequency response is the other of the third, fourth and fifth frequency responses, where in the third, fourth and fifth frequency responses respectively correspond to pulse shaping on the input modulation signal, compensation for the distortion induced by the phase locked loop and compensation for the distortion induced by the frequency regenerator.

64. The method as claimed in claim 61, wherein processing of the input modulation signal comprises an operation based on a convolution of first, second, and third frequency responses respectively corresponding to pulse shaping on the input modulation signal, compensation for the distortion induced by the phase locked loop and compensation for the distortion induced by the frequency regenerator.

65. The method as claimed in claim 54, wherein the phase locked loop further comprises an adder comprising an input, and processing of the input modulation signal comprises first, second, and third operations, wherein the first and second operations are based on first and second frequency responses respectively corresponding to pulse shaping on the input modulation signal and compensation for the distortion induced by the frequency regenerator, and the third operation comprises:
- converting the processed input modulation signal to an analog processed input modulation signal to compensate for distortion induced by the phase locked loop, and
- coupling the analog processed input modulation signal to the input of the adder.

66. The method as claimed in claim 54, wherein processing of the input modulation signal comprises first and second operations, wherein the first operation is based on a first frequency response of a convolution of second and third frequency responses respectively corresponding to pulse shaping on the input modulation signal and compensation for the distortion induced by the frequency regenerator, and the second operation comprises:
- converting the processed input modulation signal to an analog processed input modulation signal to compensate for distortion induced by the phase locked loop, and
- coupling the analog processed input modulation signal to the input of the adder.

* * * * *